United States Patent
Wang et al.

(10) Patent No.: US 8,039,393 B2
(45) Date of Patent: Oct. 18, 2011

(54) SEMICONDUCTOR STRUCTURE, METHOD FOR MANUFACTURING SEMICONDUCTOR STRUCTURE AND SEMICONDUCTOR PACKAGE

(75) Inventors: Meng-Jen Wang, Pingtung (TW); Chien-Yu Chen, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 13/088,954

(22) Filed: Apr. 18, 2011

(65) Prior Publication Data

US 2011/0195568 A1    Aug. 11, 2011

Related U.S. Application Data

(62) Division of application No. 12/484,860, filed on Jun. 15, 2009.

(30) Foreign Application Priority Data

Jun. 27, 2008    (TW) .............................. 97124100 A

(51) Int. Cl.
    H01L 21/44    (2006.01)
(52) U.S. Cl. .. 438/667; 438/672; 438/694; 257/E21.597
(58) Field of Classification Search .......... 438/666–668, 438/672, 694, 696; 257/E21.597
See application file for complete search history.

(56) References Cited

U.S. PATENT DOCUMENTS

| | | | |
|---|---|---|---|
| 2006/0118965 A1 | 6/2006 | Matsui | |
| 2008/0079121 A1 | 4/2008 | Whan | |
| 2009/0014843 A1 | 1/2009 | Kawashita et al. | |
| 2009/0315159 A1* | 12/2009 | Abbott | 257/666 |

* cited by examiner

*Primary Examiner* — Thanhha Pham
(74) *Attorney, Agent, or Firm* — Muncy, Geissler, Olds & Lowe, PLLC

(57) ABSTRACT

A semiconductor structure, a method for manufacturing a semiconductor structure and a semiconductor package are provided. The method for manufacturing a semiconductor structure includes the following steps. Firstly, a silicon substrate is provided. Next, a part of the silicon substrate is removed to form a ring hole and a silicon pillar surrounded by the silicon pillar. Then, a photosensitive material is disposed in the ring hole, wherein the photosensitive material is insulating. After that, the silicon pillar is removed, such that the ring hole forms a through hole and the photosensitive material covers a lateral wall of the through hole. Lastly, the conductive material is disposed in the through hole, wherein the outer surface of the conductive material is surrounded by the photosensitive material.

20 Claims, 26 Drawing Sheets

SEMICONDUCTOR STRUCTURE, METHOD FOR MANUFACTURING SEMICONDUCTOR STRUCTURE AND SEMICONDUCTOR PACKAGE

This application is a divisional application of co-pending U.S. application Ser. No. 12/484,860, filed Jun. 15, 2009. This application claims the benefit of Taiwan application Serial No. 97124100, filed Jun. 27, 2008. The subject matter of these applications is incorporated herein by reference.

BACKGROUND OF THE INVENTION

1. Field of the Invention

The invention relates in general to a semiconductor structure, a method for manufacturing a semiconductor structure and a semiconductor package and more particularly to a semiconductor structure using through silicon via technology, a method for manufacturing a semiconductor structure and a semiconductor package.

2. Description of the Related Art

As electronic products are directed towards slimness, light weight and compactness, the semiconductor structure using through silicon via (TSV) technology has become a mainstream trend. Referring to FIGS. 1A~1G, perspectives of a method for manufacturing a semiconductor structure 900 using through silicon via technology are shown. The manufacturing method includes the following steps. Firstly, referring to FIG. 1A, a silicon wafer 910 having a first surface 910a and a second surface 910b is provided. Next, referring to FIG. 1B, an indent 910c is formed on the first surface 910a by dry etching. Then, referring to FIG. 1C, an insulating layer 920 made from silicon nitride material for example is formed by chemical vapor deposition (CVD) technology to cover the first surface 910a and the inner wall of the indent 910c. After that, referring to FIG. 1D, a copper material 940 is electroplated in the indent 910c. Then, referring to FIG. 1E, a conductive pad 950 is formed on the first surface 910a and covers the indent 910c. Afterwards, referring to FIG. 1F, the second surface 910b is polished until the copper material 940 filled in the indent 910c is exposed. Lastly, referring to FIG. 1G, another conductive pad 960 is formed on the second surface 910b and covers the indent 910c. Thus, a semiconductor structure 900 is formed.

The first surface 910a and the second surface 910b of the silicon wafer 910 can be contacted with each other through the conductive pad 950, the copper material 940 and the conductive pad 960. The copper material 940 and the first surface 910a are both protected by the insulating layer 920.

However, according to the conventional method for manufacturing the semiconductor structure 900, the insulating layer 920 is formed by CVD technology. As the CVD technology equipment is expensive, more manufacturing costs are incurred.

Furthermore, according to the conventional method for manufacturing the semiconductor structure 900, the copper material 940 is exposed by way of polishing the second surface 910b, not only incurring more manufacturing process and more time, but also easily damaging the silicon wafer 910. Thus, there are many bottleneck technologies in the through silicon via technology of the silicon wafer 910 that need to be resolved.

SUMMARY OF THE INVENTION

The invention is directed to a semiconductor structure and a method for manufacturing a semiconductor structure and a semiconductor package. As the photosensitive material is used as an insulating layer, the method for manufacturing the semiconductor structure does not require the CVD process nor require the step of grinding the silicon substrate, hence largely reducing manufacturing cost and increasing product yield rate.

According to a first aspect of the present invention, a method for manufacturing a semiconductor structure is provided. The manufacturing method includes the following steps. Firstly, a silicon substrate is provided. Next, a part of the silicon substrate is removed to form a ring hole and a silicon pillar surrounded by the ring hole. Then, a photosensitive material is disposed in the ring hole, wherein the photosensitive material is insulating. After that, the silicon pillar is removed, such that the ring hole forms a through hole and the photosensitive material covers a lateral wall of the through hole. Lastly, a conductive material is disposed in the through hole, wherein an outer surface of the conductive material is surrounded by the photosensitive material.

According to a second aspect of the present invention, a semiconductor structure including a silicon substrate, a photosensitive material and a conductive material is provided. The silicon substrate has a through hole. The photosensitive material covers a lateral wall of the through hole, wherein the photosensitive material is insulating. The conductive material is disposed in the through hole, wherein an outer surface of the conductive material is surrounded by the photosensitive material.

According to a third aspect of the present invention, a semiconductor package is provided. The semiconductor package comprises a package substrate, a silicon interposer and a chip. The silicon interposer is disposed above the package substrate and comprises a silicon substrate, a photosensitive material and a conductive material. The silicon substrate has a through hole. The photosensitive material covers a lateral wall of the through hole. The photosensitive material is insulating. The conductive material is disposed in the through hole and an outer surface of the conductive material is surrounded by the photosensitive material. The chip is disposed above the silicon interposer.

The invention will become apparent from the following detailed description of the preferred but non-limiting embodiments. The following description is made with reference to the accompanying drawings.

DETAILED DESCRIPTION OF THE INVENTION

The invention is elaborated in preferred embodiments disclosed below. These embodiments are for exemplification purpose not for limiting the scope of protection of the invention. Also, secondary elements are omitted in the preferred embodiments below for highlighting the technical features of the invention.

Figure 1A:
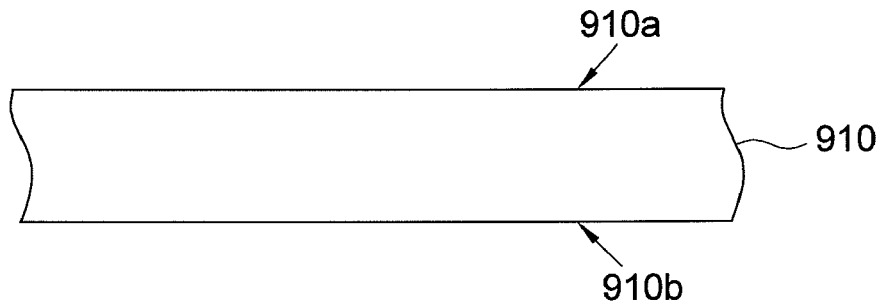
FIGS. 1A~1G (Prior Art) are perspectives of a method for manufacturing a semiconductor structure using through silicon via technology.
Figure 1B:
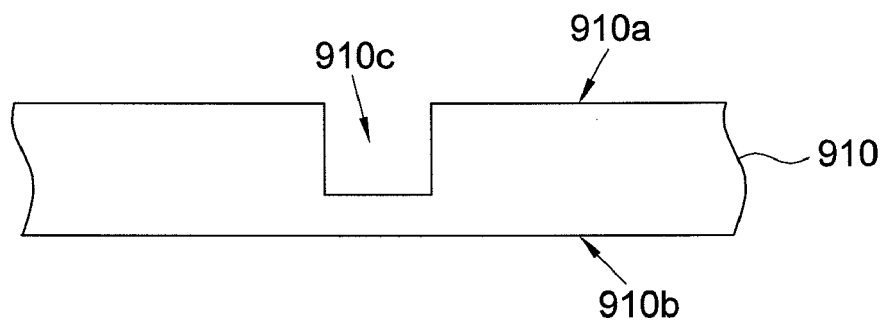
Figure 1C:
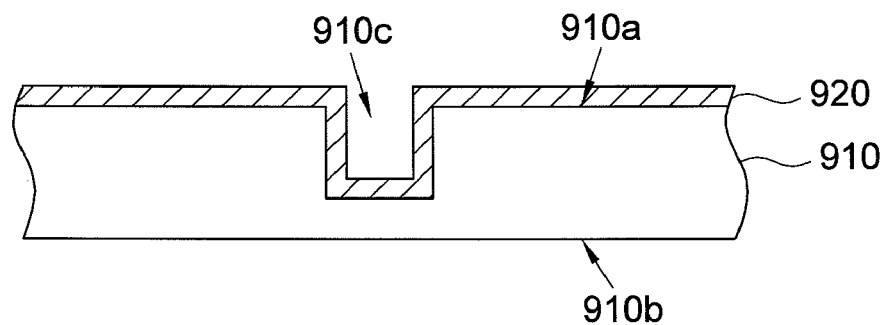
Figure 1D:
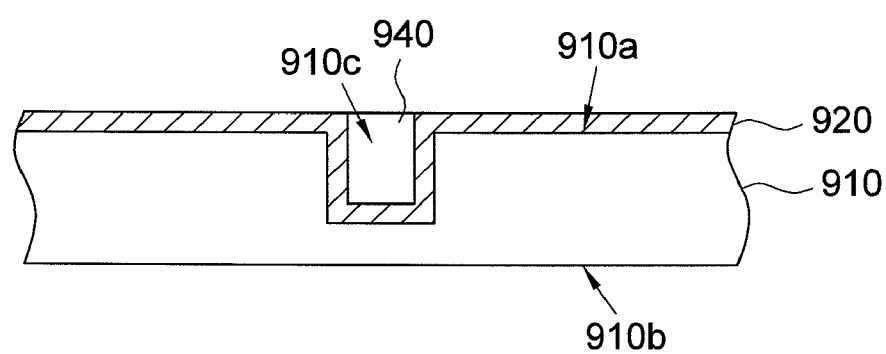
Figure 1E:
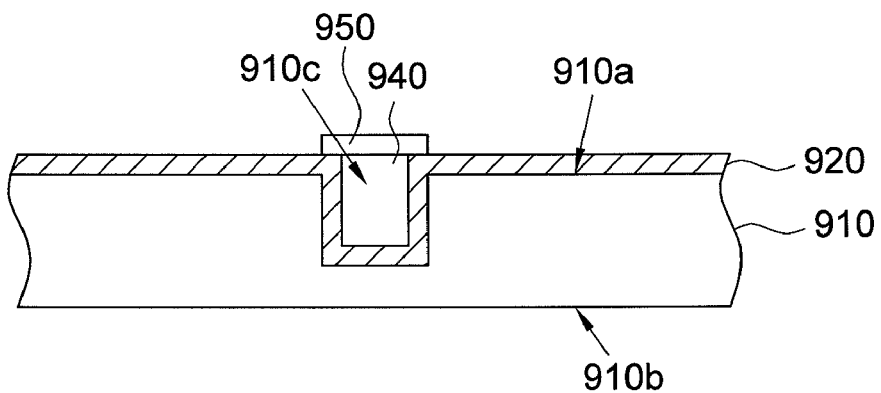
Figure 1F:
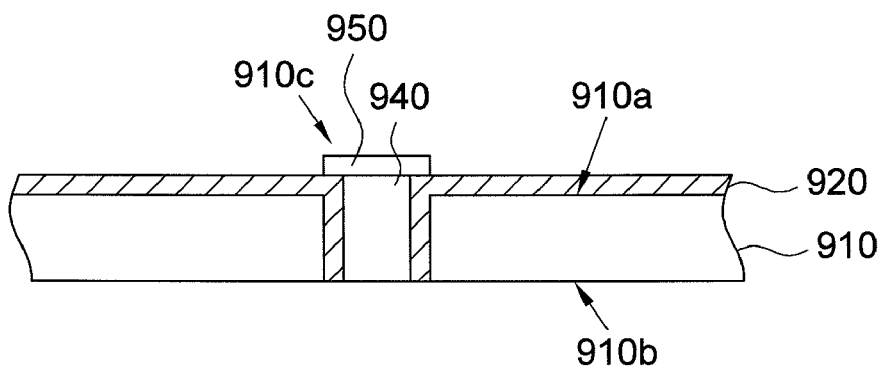
Figure 1G:
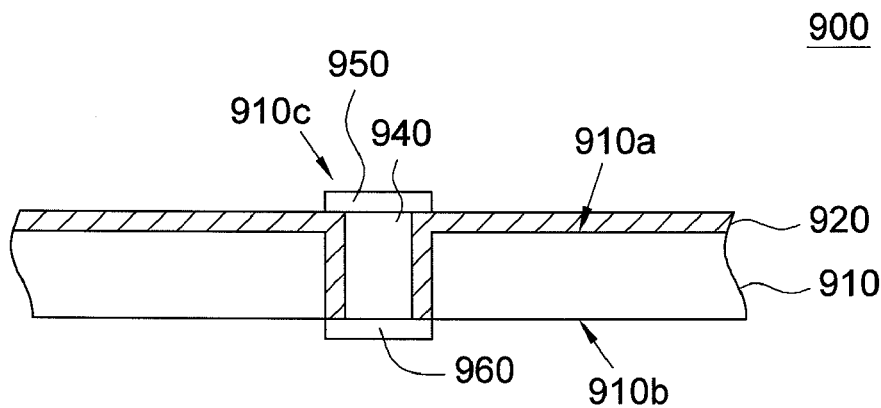
Figure 2:
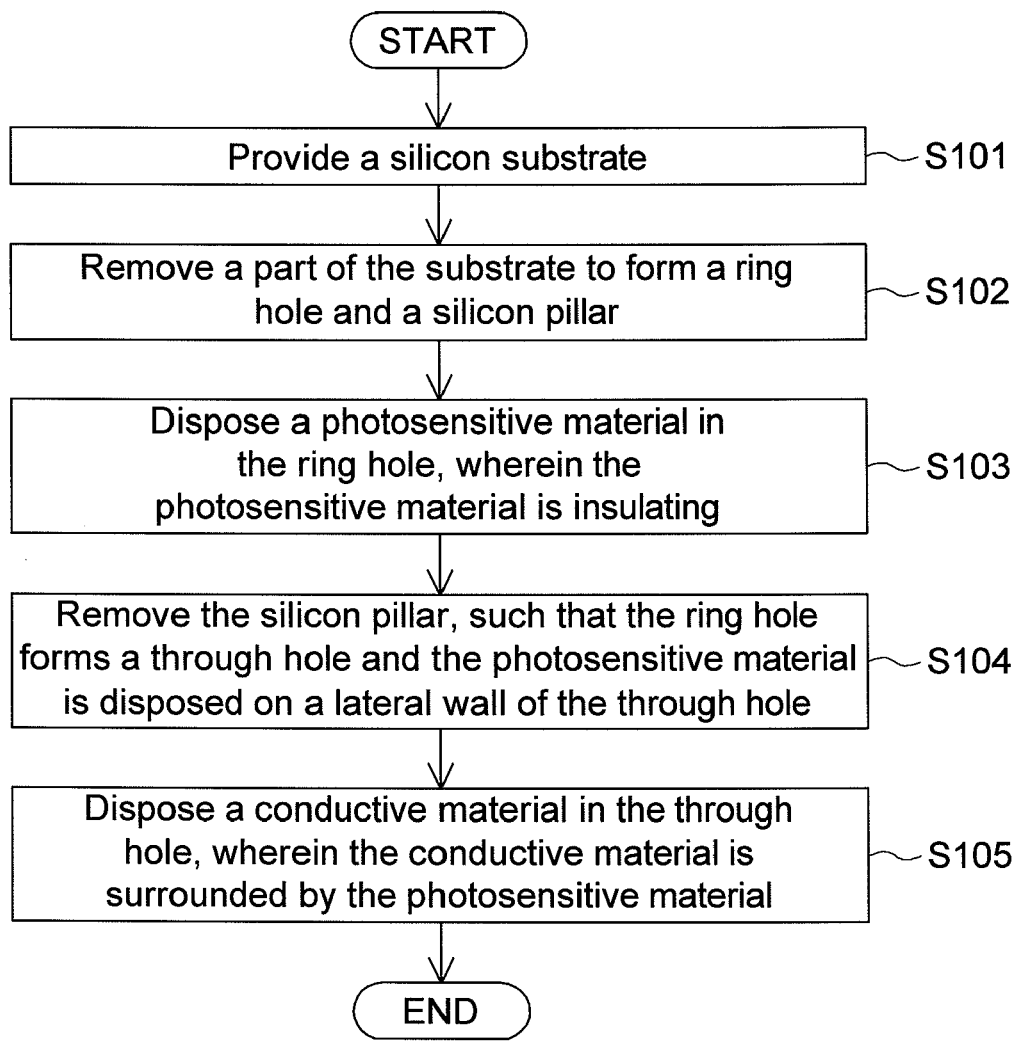
FIG. 2 shows a flowchart of a method for manufacturing a semiconductor structure according to the invention.
Figure 3A:
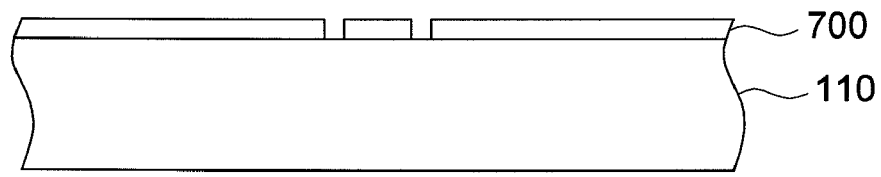
FIGS. 3A~3K are perspectives of a method for manufacturing a semiconductor structure according to a preferred embodiment of the invention.

Referring to FIG. 2 and at the same time comparing FIG. 2 to FIGS. 3A~3K. Firstly, the method begins at step S101 as indicated in FIG. 3A, a silicon substrate 110 is provided. To be more precisely, a photoresist layer 700 is disposed on the silicon substrate 110, wherein the silicon substrate 110 may be a silicon wafer having an internal circuit or a dummy silicon wafer having no circuit and the photoresist layer 700 is patterned.

Figure 3B:
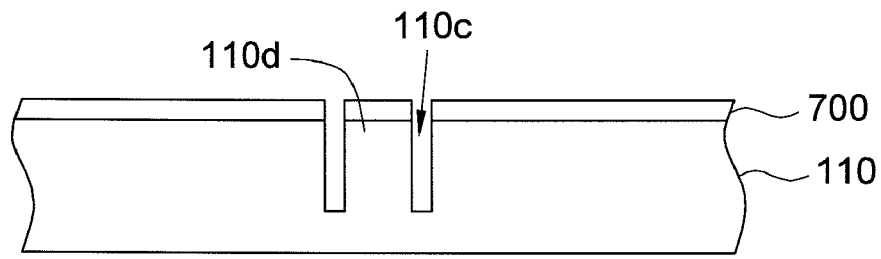
Figure 3C:
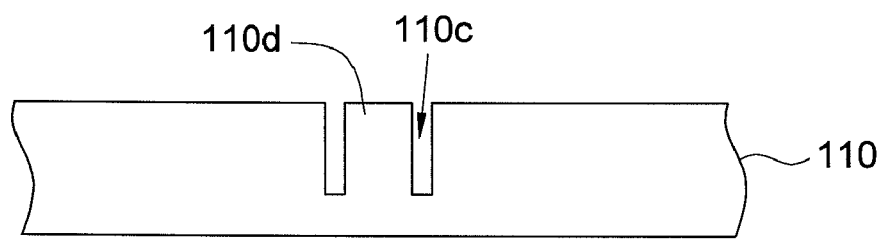

Next, the method proceeds to step S102 as indicated in FIG. 3B, a part of the silicon substrate 110 is removed to form a ring hole 110c and a silicon pillar 110d, and as indicated in FIG. 3C, the photoresist layer 700 (shown in FIG. 3B) is removed. To be more precisely, the patterned photoresist layer 700 is used as a mask to etch the silicon substrate 110 to form the ring hole 110c and the silicon pillar 110d, wherein the ring hole 110c surrounds the silicon pillar 110d and the ring hole 110c may or may not pass through the silicon substrate 110. In the present embodiment of the invention, the ring hole 110c does not pass through the silicon substrate 110 but such exemplification is not for limiting the invention.

Figure 3D:
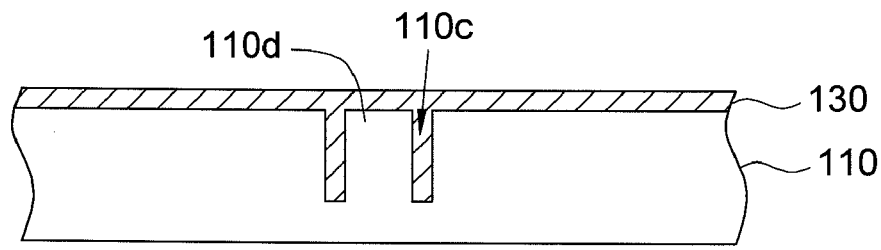
Figure 3E:
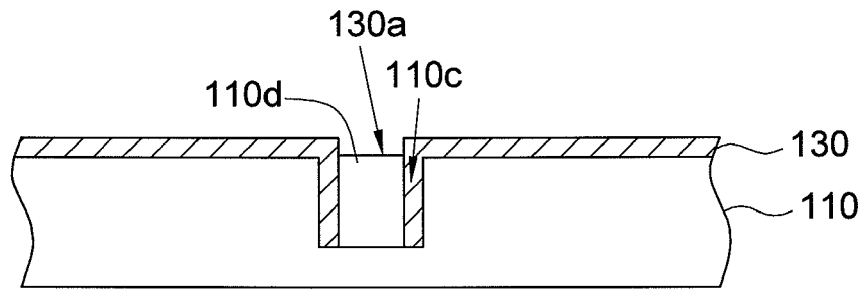

Then, the method proceeds to step S103 as indicated in FIG. 3D, a photosensitive material 130 is disposed in the ring hole 110c, wherein the photosensitive material 130 is insulating and the thickness of the photosensitive material is 3-10 μm. As indicated in FIG. 3E, the photosensitive material 130 is patterned such that the photosensitive material 130 has an opening 130a corresponding to the silicon pillar 110d.

Figure 3F:
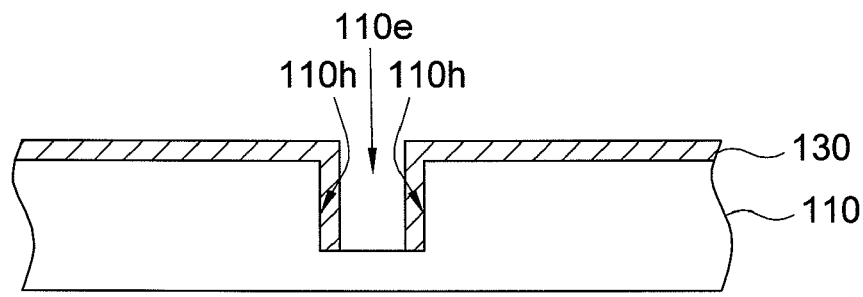

After that, the method proceeds to step S104 as indicated in FIG. 3F, the patterned photosensitive material 130 is used as a mask and the silicon pillar 110d (shown in FIG. 3E) is removed, such that the ring hole 110c (shown in FIG. 3E) forms a through hole 110e and the photosensitive material 130 covers a lateral wall 110h of the through hole 110e.

Figure 3G:
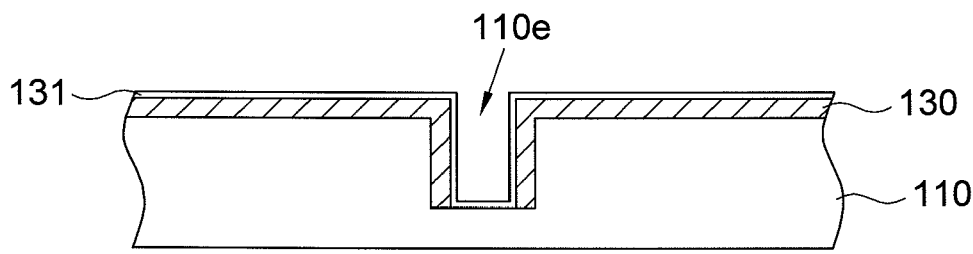
Figure 3H:
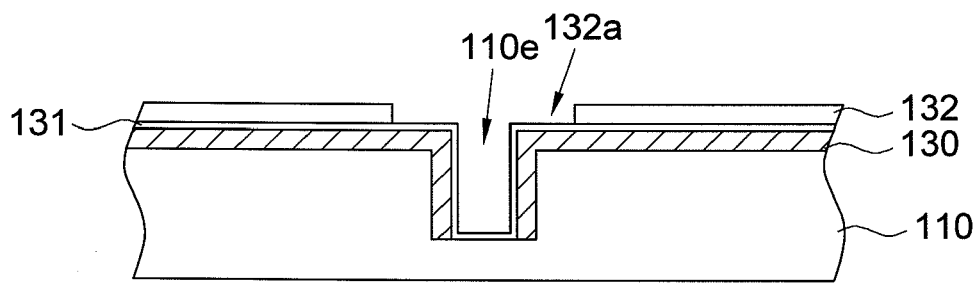
Figure 3I:
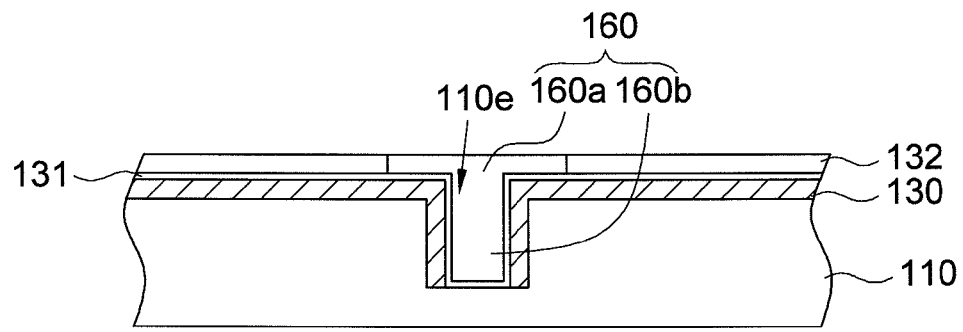
Figure 3J:
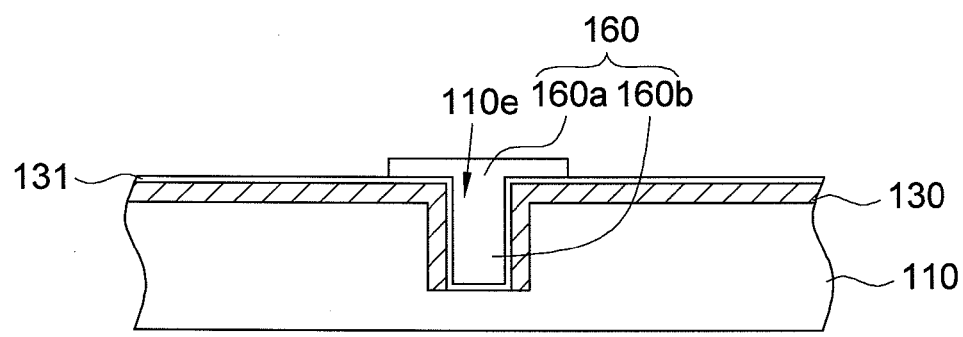
Figure 3K:
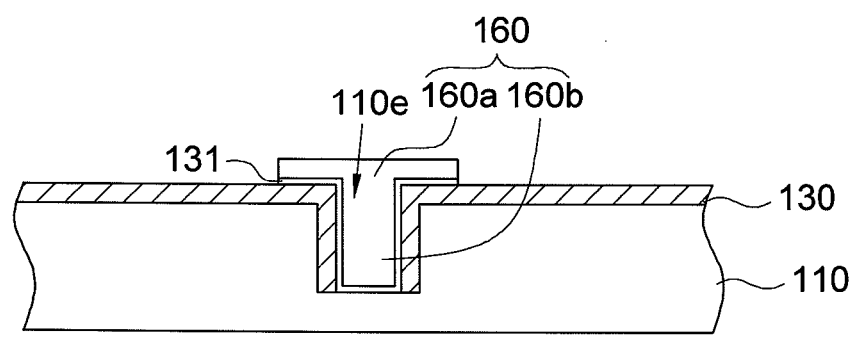

Lastly, the method proceeds to step S105 as indicated in FIGS. 3G~3K, a conductive material 160 (shown in FIG. 3K) is disposed in the through hole 110e, wherein the conductive material 160 is surrounded by the photosensitive material 130. Referring to FIG. 3G, a seed layer 131 is disposed on the photosensitive material 130 and the bottom surface of the through hole 110e. Next, referring to FIG. 3H, a photoresist layer 132 having an opening 132a is disposed on the seed layer 131. After that, referring to FIG. 3I, the conductive material 160 is filled in the through hole 110e. Wherein, the bottom part of the conductive material 160 forms a conductive pillar 160b, and the top part of the conductive material 160 forms a second conductive wiring 160a. Wherein the second conductive wiring 160a can be used as a redistribution layer (RDL). Then, referring to FIG. 3J, the photoresist layer 132 (shown in FIG. 3I) is removed. Afterwards, referring to FIG. 3K, part of the seed layer 131 is removed.

To be more precisely, the conductive material 160 may fill the entire through hole 110e or only form a thin film on the photosensitive material 130. In the present embodiment of the invention, the conductive material 160 fills the entire through hole 110e as an exemplification.

According to the above arrangement, there is no need to employ expensive CVD equipment or polish the silicon substrate, hence greatly simplifying manufacturing process and avoiding the silicon substrate being damaged. Thus, the method for manufacturing a semiconductor structure according to the invention largely reduces manufacturing cost and increases product yield rate.

Figure 4:
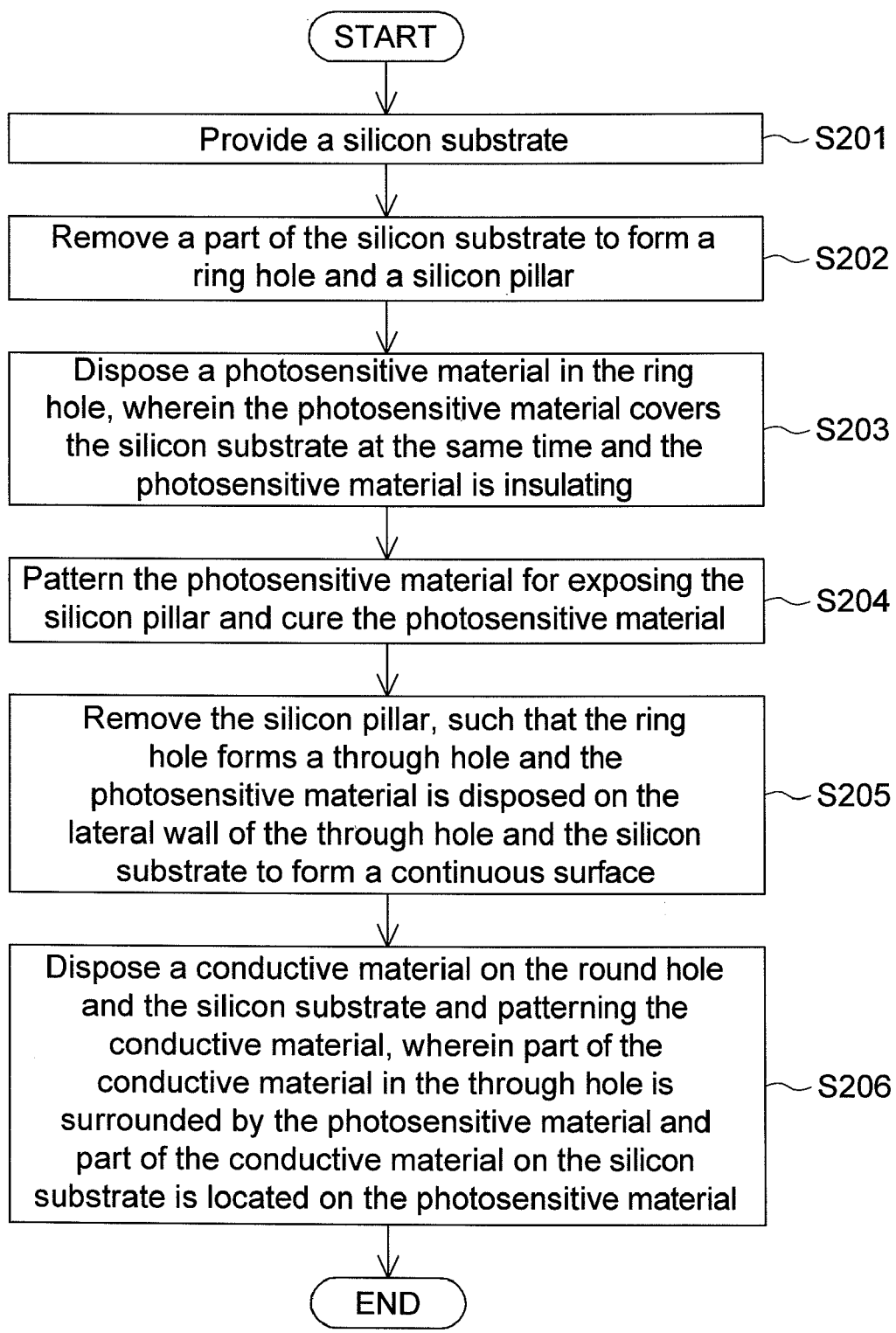
FIG. 4 shows another flowchart of a method for manufacturing a semiconductor structure according to the invention.

Also, referring to FIG. 4, another flowchart of a method for manufacturing a semiconductor structure according to the invention is shown. The manufacturing method of FIG. 4 is a practical embodiment of the manufacturing method of FIG. 2.

Firstly, the method begins at step S201, a silicon substrate is provided. Next, the method proceeds to step S202, a part of the silicon substrate is removed to form a ring hole and a silicon pillar surrounded by the ring hole. Then, the method proceeds to step S203, a photosensitive material is disposed in the ring hole and the photosensitive material covers the silicon substrate at the same time, wherein the photosensitive material is insulating. After that, the method proceeds to step S204, the photosensitive material is patterned for exposing the silicon pillar and curing the photosensitive material. Afterwards, the method proceeds to step S205, the silicon pillar is removed such that the ring hole forms a through hole and the photosensitive material covers a lateral wall of the through hole and the silicon substrate to form a continuous surface. Lastly, the method proceeds to step S206, a conductive material is disposed in the through hole and the silicon substrate, and the conductive material is patterned, wherein part of the conductive material in the through hole is surrounded by the photosensitive material, and part of the conductive material disposed on the silicon substrate is located on the photosensitive material.

To further elaborate the flowchart of FIG. 2, FIGS. 5A~5K are further disclosed to elaborate the implementations. Firstly, referring to FIG. 5A, a silicon substrate 210 is provided. To be more precisely, a photoresist layer 702 is disposed on the silicon substrate 210, wherein the silicon substrate 210 may be a silicon wafer having an internal circuit or a dummy silicon wafer having no circuit and the photoresist layer 702 is patterned.

Figure 5A:
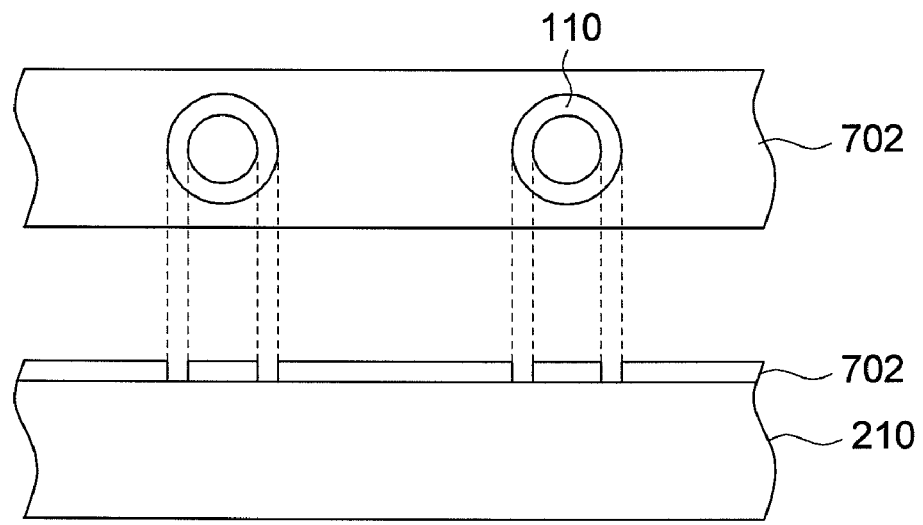
FIGS. 5A~5K are other perspectives of a method for manufacturing a semiconductor structure according to a preferred embodiment of the invention.
Figure 5B:
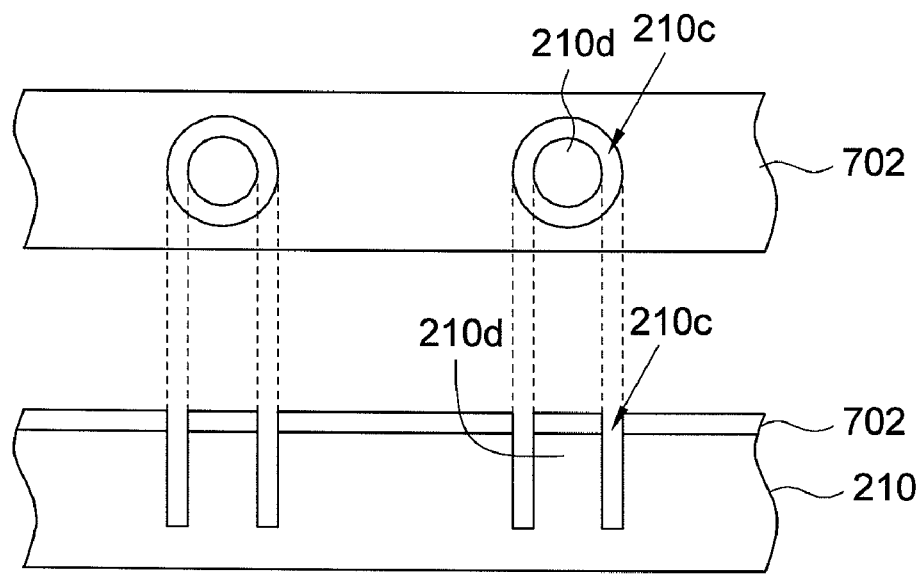
Figure 5C:
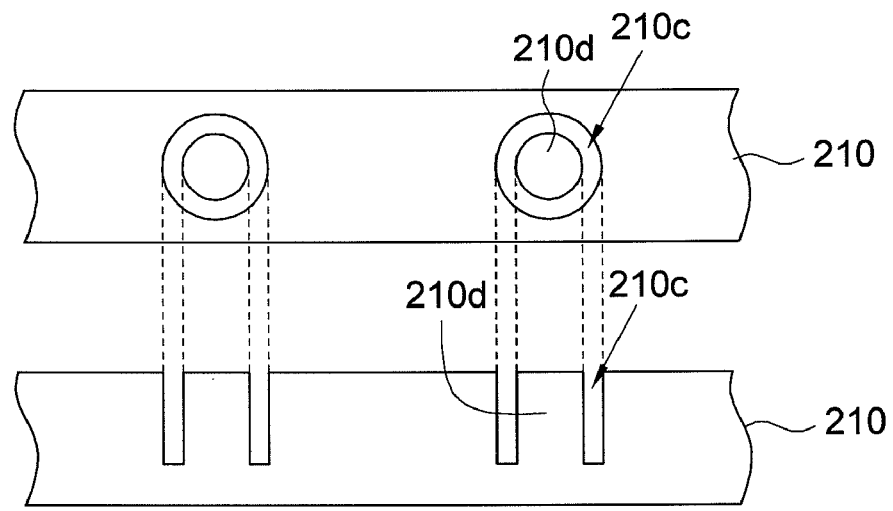

Next, referring to FIG. 5B, a part of the silicon substrate 210 is removed to form a ring hole 210c and a silicon pillar 210d, and as indicated in FIG. 5C, the photoresist layer 702 (shown in FIG. 5B) is removed. To be more precisely, the patterned photoresist layer 702 is used as a mask to etch the silicon substrate 210 to form the ring hole 210c and the silicon pillar 210d, wherein the ring hole 210c surrounds the silicon pillar 210d and the ring hole 210c may or may not pass through the silicon substrate 210. In the present embodiment of the invention, the ring hole 210c does not pass through the silicon substrate 210 but such exemplification is not for limiting the invention.

Figure 5D:
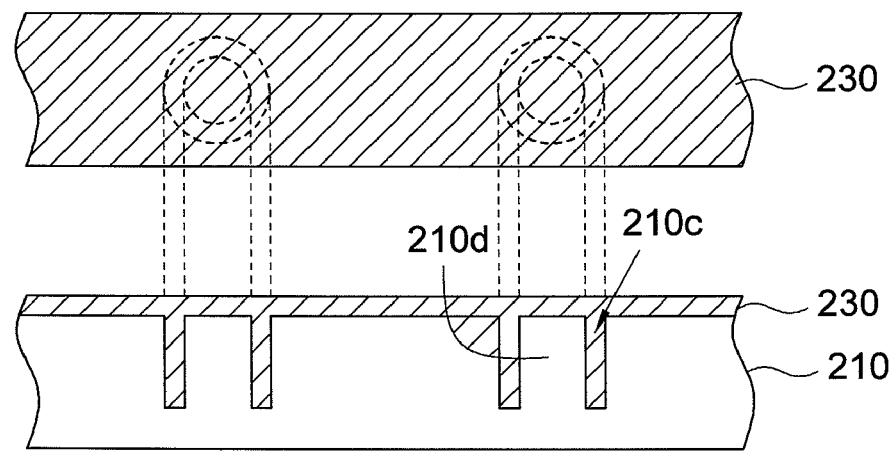
Figure 5E:
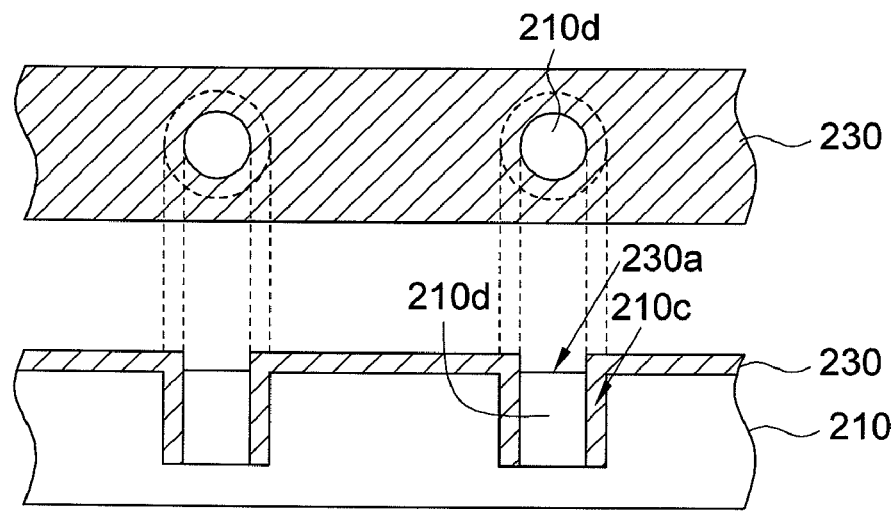

Then, referring to FIG. 5D, a photosensitive material 230 is disposed in the ring hole 210c, wherein the photosensitive material 230 is insulating and the thickness of the photosensitive material is 3-10 μm. As indicated in FIG. 5E, the photosensitive material 230 is patterned such that the photosensitive material 230 has an opening 230a corresponding to the silicon pillar 210d.

Figure 5F:
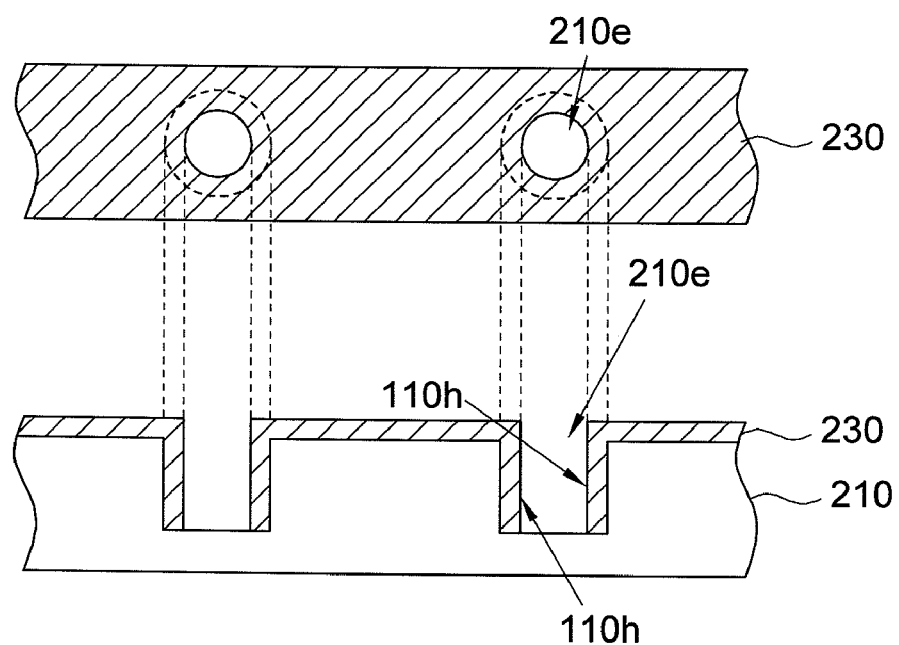

After that, referring to FIG. 5F, the patterned photosensitive material 230 is used as a mask and the silicon pillar 210d (shown in FIG. 5E) is removed, such that the ring hole 210c (shown in FIG. 5E) forms a through hole 210e and the photosensitive material 230 covers a lateral wall 210h of the through hole 210e.

Figure 5G:
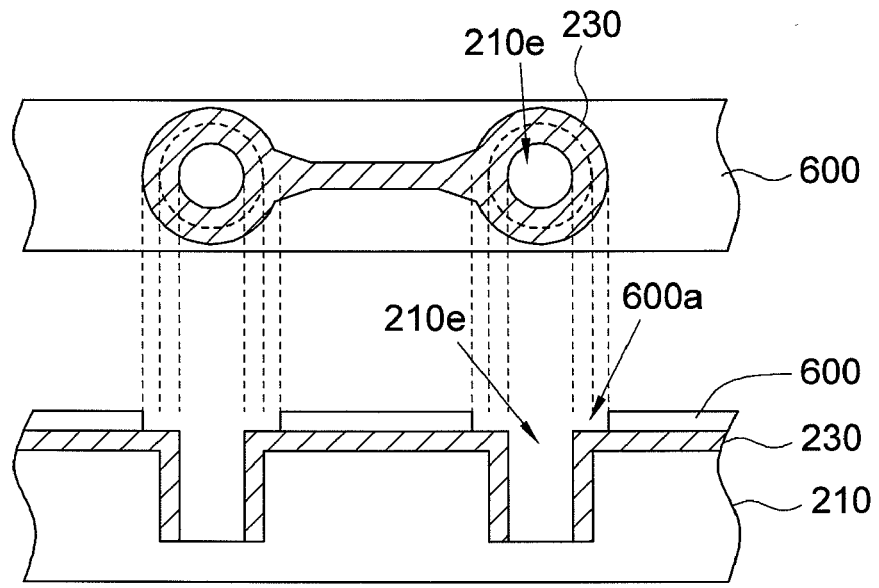

Next, referring to FIG. 5G, another patterned photoresist layer 600 is formed on the photosensitive material 230, wherein the patterned photoresist layer 600 has an opening 600a corresponding to the through hole 210e.

Figure 5H:
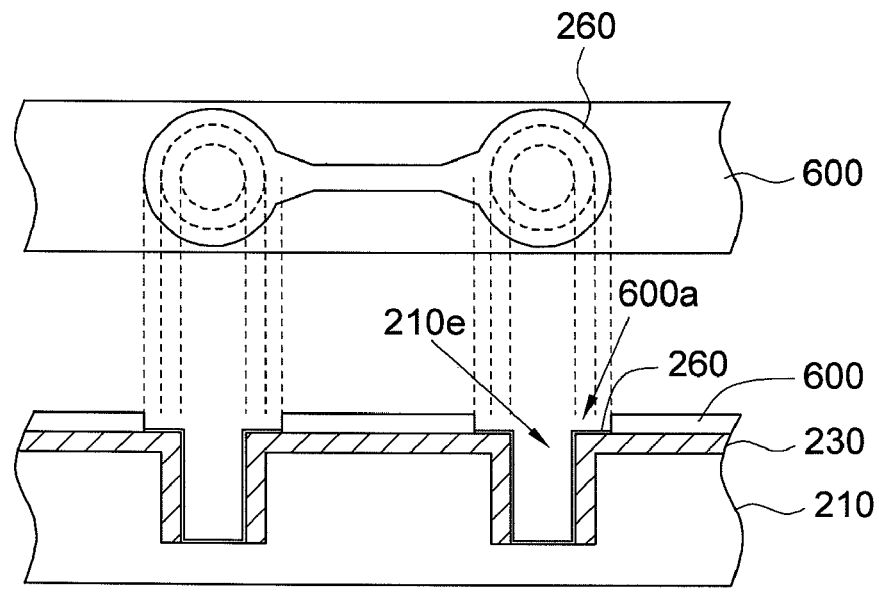

Next, as indicated in FIG. 5H, the patterned photoresist layer 600 is used as a mask, and a conductive material 260 is disposed in the through hole 210e through the opening 600a, wherein the conductive material 260 is surrounded by the photosensitive material 230. In the present embodiment of the invention, the conductive material 260, which is exemplified as a thin film disposed on the photosensitive material 230, does not fill up the through hole 210e.

Figure 5I:
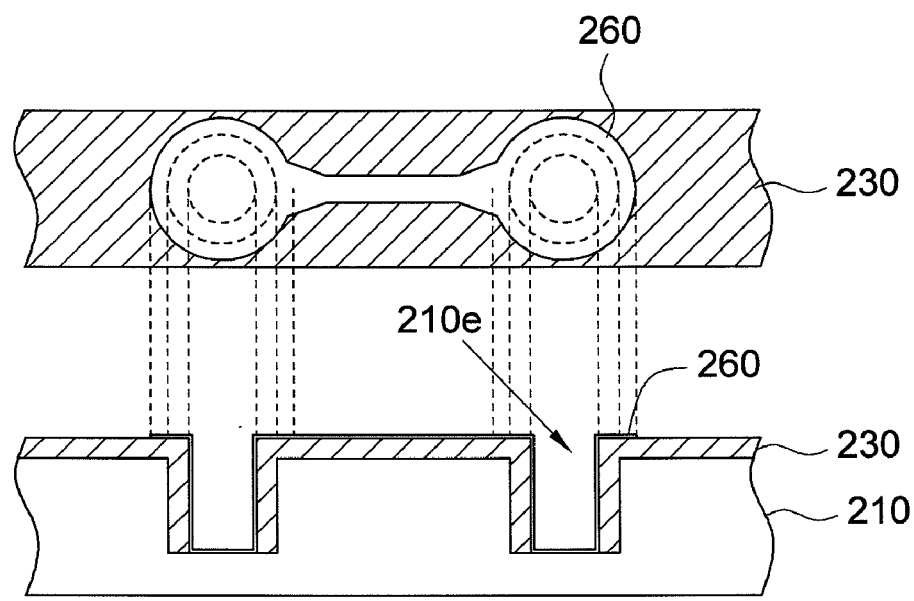

Then, as indicated in FIG. 5I, the photoresist layer 600 (shown in FIG. 5H) is removed.

Figure 5J:
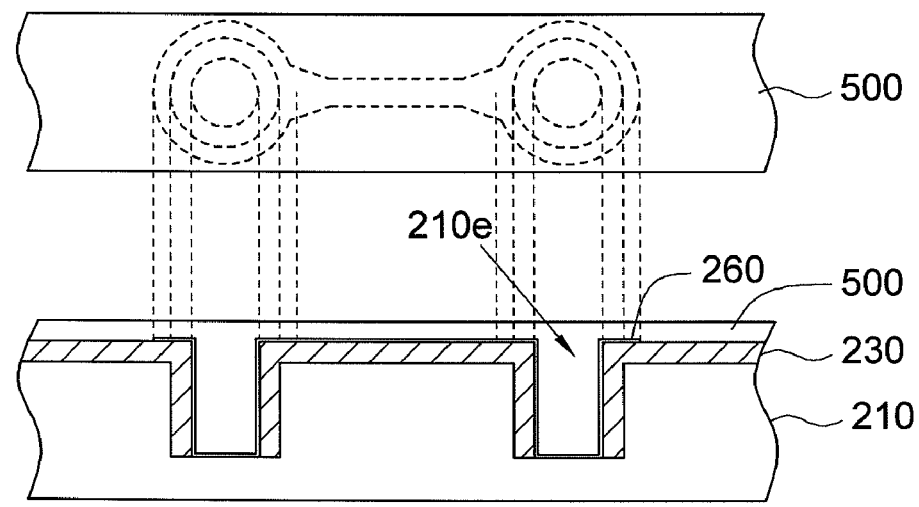

After that, as indicated in FIG. 5J, a photosensitive material 500 is disposed on the conductive material 260 and the photosensitive material 230. The photosensitive material 500 and the photosensitive material 230 are both insulating, but such exemplification is not for limiting the invention.

Figure 5K:
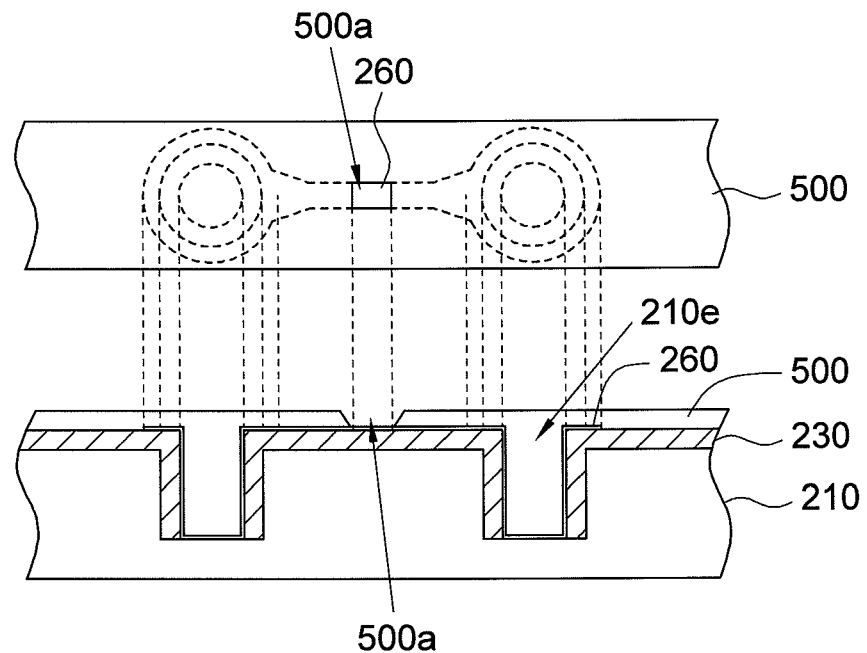

Next, referring to FIG. 5K, the photosensitive material 500 is etched to form an opening 500a. The opening 500a exposes part of the conductive material 260. Wherein part of the conductive material 260 can be use as a redistribution layer (RDL).

Furthermore, another embodiment based on the concepts of FIG. 2 is provided. Referring to FIG. 6A~6K, yet other perspectives of a method for manufacturing a semiconductor structure according to a preferred embodiment of the invention are shown.

Figure 6A:
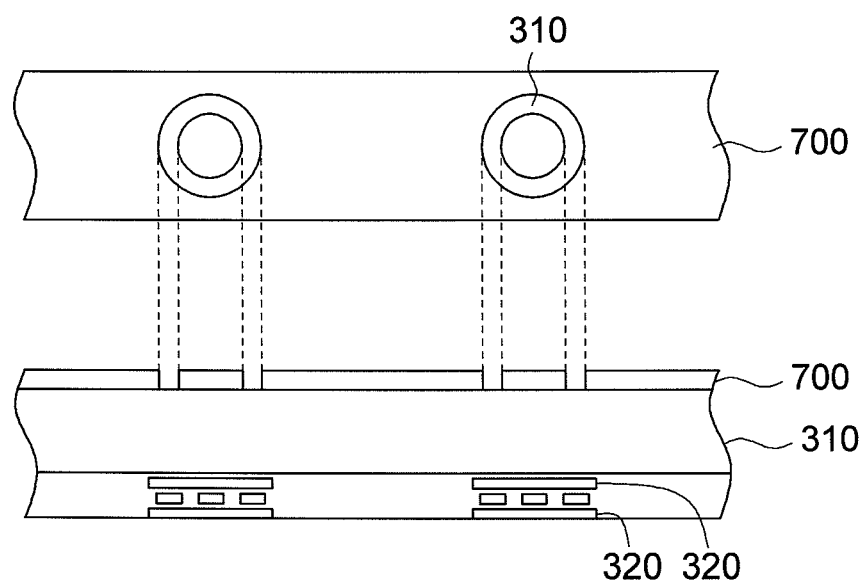
FIGS. 6A~6K are yet other perspectives of a method for manufacturing a semiconductor structure according to a preferred embodiment of the invention.
Figure 6B:
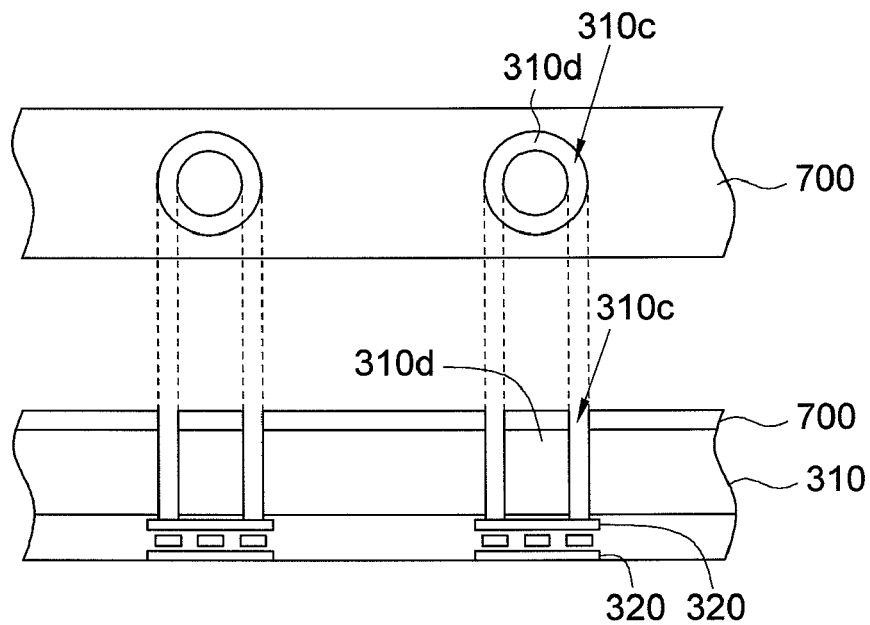
Figure 6C:
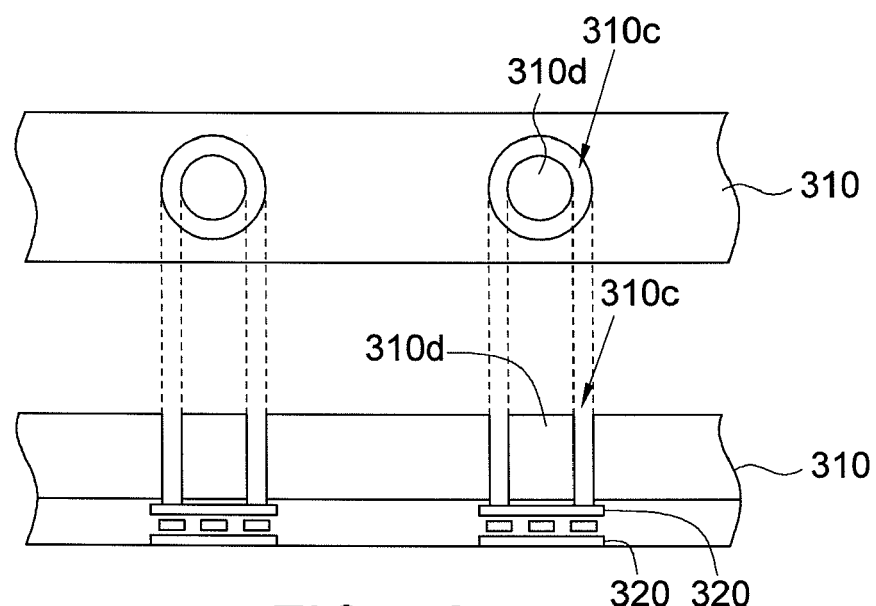
Figure 6D:
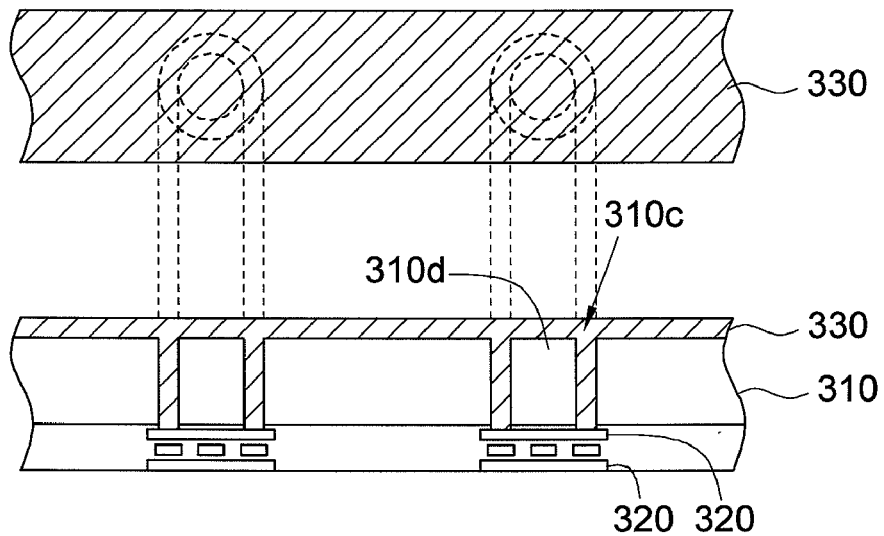
Figure 6E:
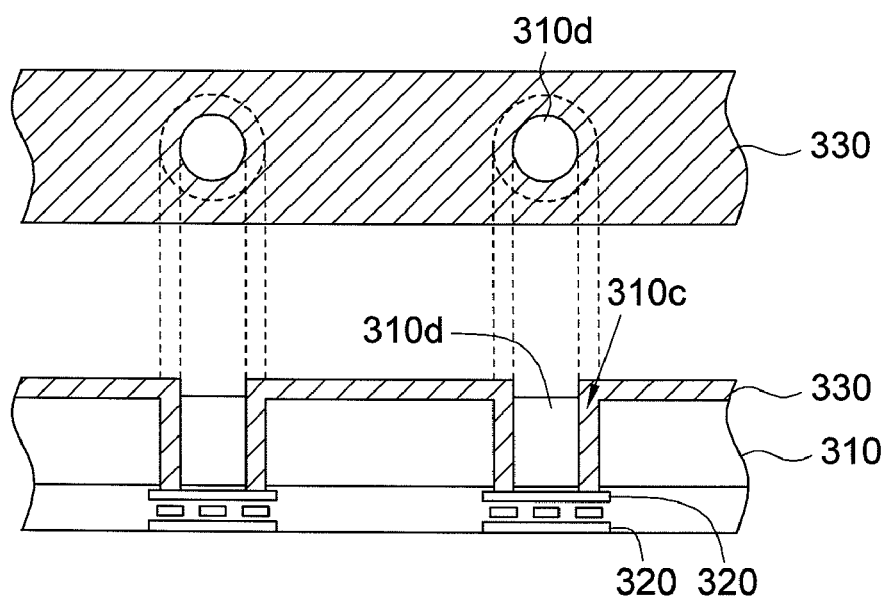
Figure 6F:
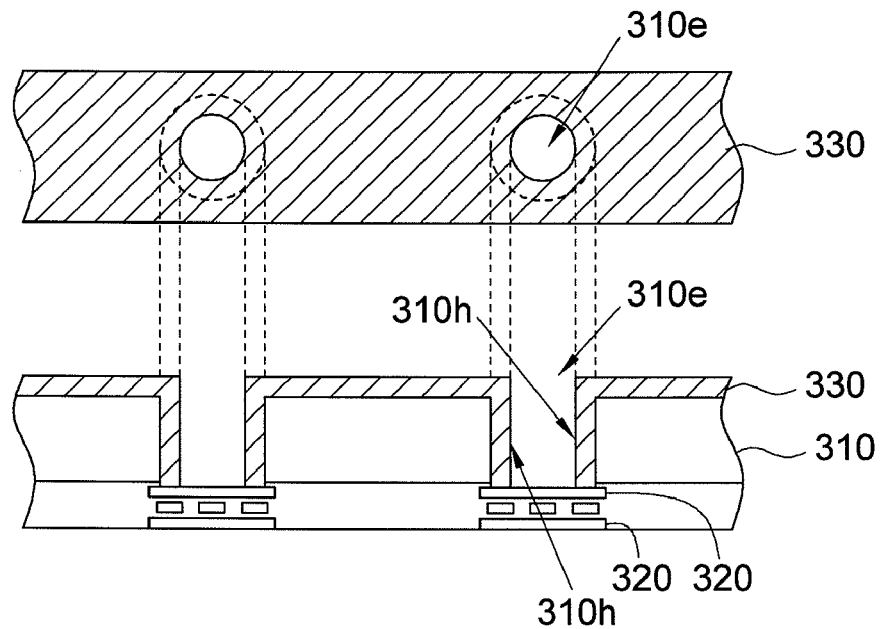

In FIG. 6A, a silicon substrate 310 has an internal wire 320 is provided. Then, in FIG. 6B, the surface of the silicon substrate 310 is etched to form a ring hole 310c and a silicon pillar 310d. Wherein the ring hole 310c exposes the internal wire 320. Next, referring to FIGS. 6C~6F, the internal wire 320 is exposed after the silicon pillar 310d is removed. Wherein a photosensitive material 330 covers a lateral wall 310h of the through hole 310e.

Figure 6G:
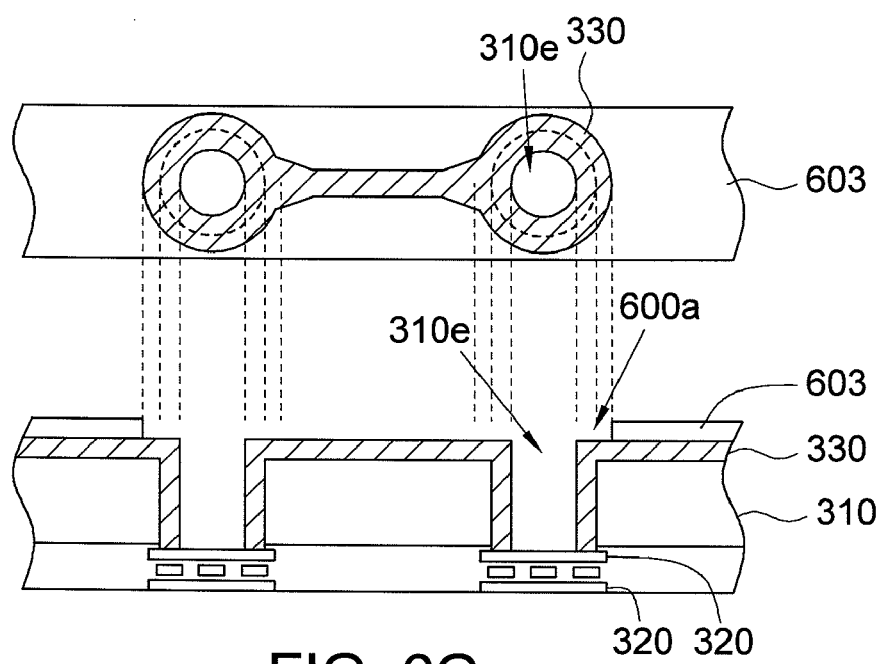
Figure 6H:
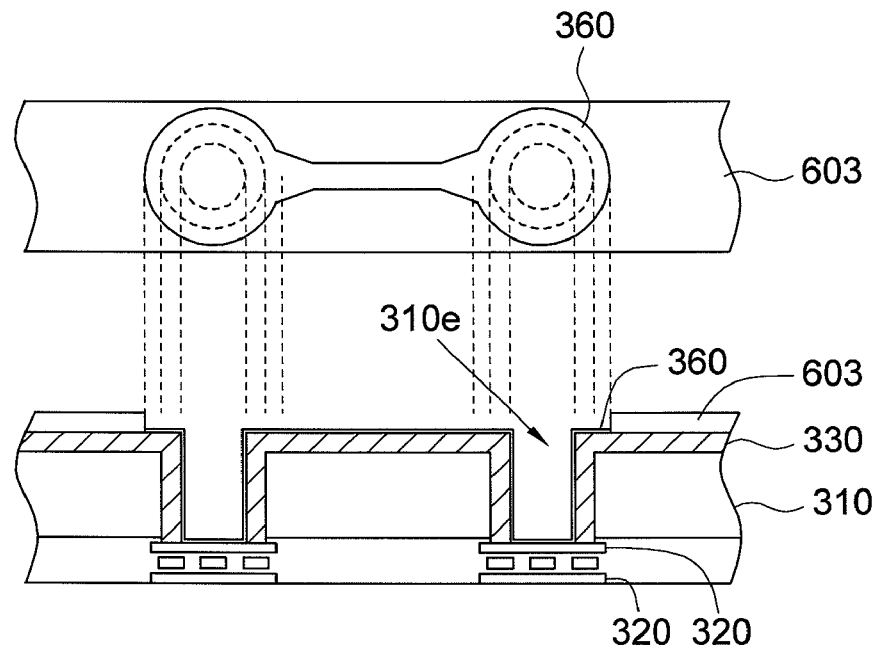

Next, referring to FIGS. 6G~6H, a conductive material 360 is disposed in the through hole 310e and on the photosensitive material 330 by taking a photoresist layer 603 as a mask.

Figure 6I:
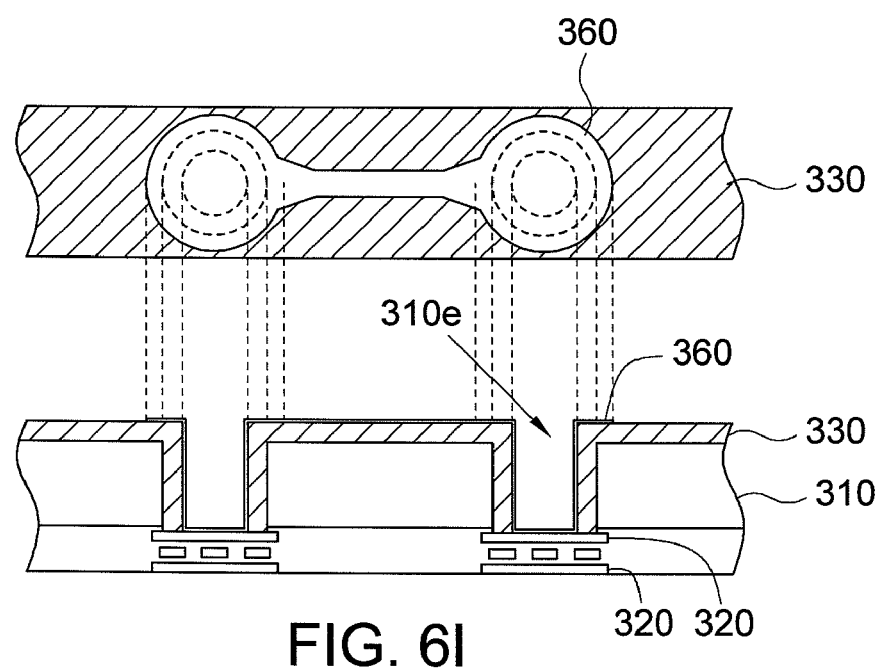
Figure 6J:
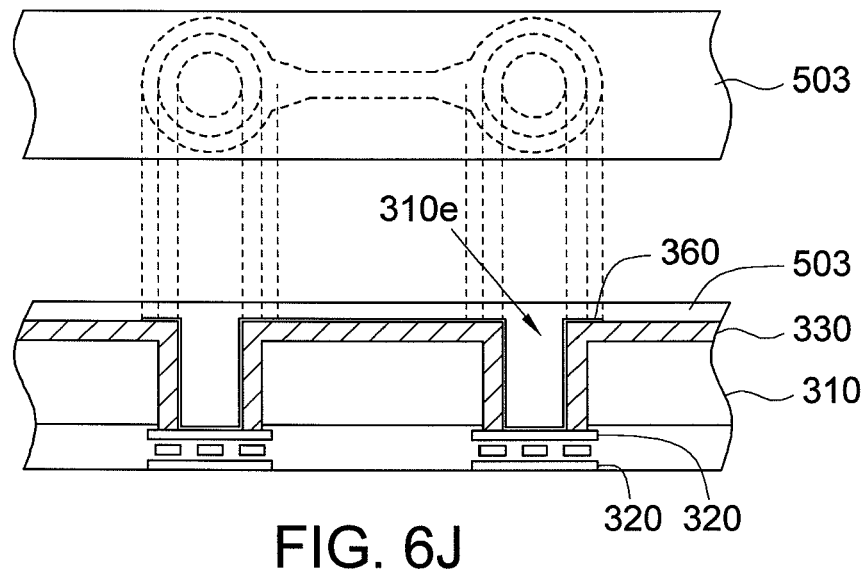
Figure 6K:
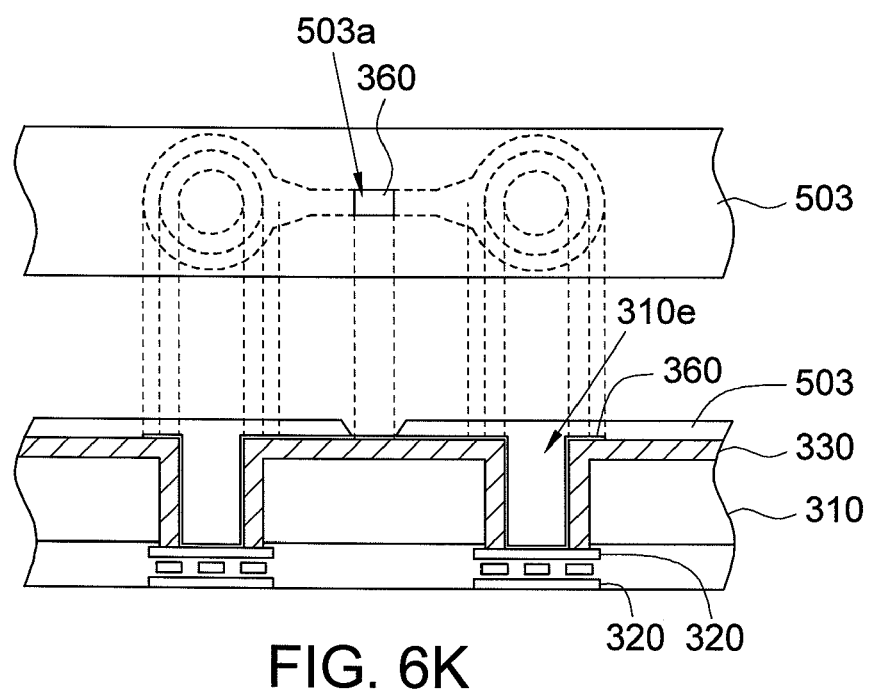

Then, referring to FIGS. 6I~6K, the photoresist layer 603 (shown in FIG. 6H) is removed and a photosensitive material 503 having an opening 503a is disposed on the conductive material 360, such that the conductive material 360 can be use as a redistribution layer (RDL).

Figure 7A:
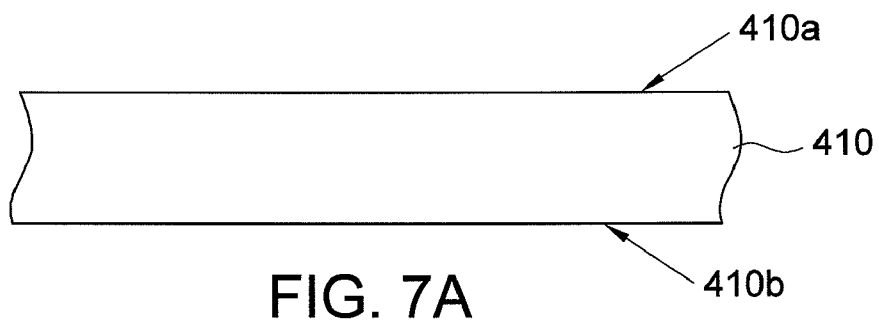
FIG. 7A~7O are further perspectives of a method for manufacturing a semiconductor structure according to a preferred embodiment of the invention.

Besides, another embodiment based on the concepts of FIG. 2 is also provided. Referring to FIG. 7A~7O, further perspectives of a method for manufacturing a semiconductor structure according to a preferred embodiment of the invention are shown.

In FIG. 7A, a silicon substrate 410 having a first surface 410a and a second surface 410b is provided. The silicon substrate 410 is a silicon wafer for example.

Figure 7B:
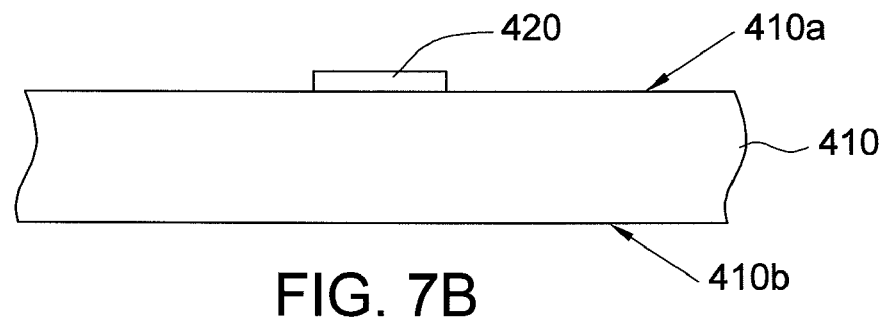

In FIG. 7B, a first conductive wiring 420 is formed on the first surface 410a of the silicon substrate 410.

Figure 7C:
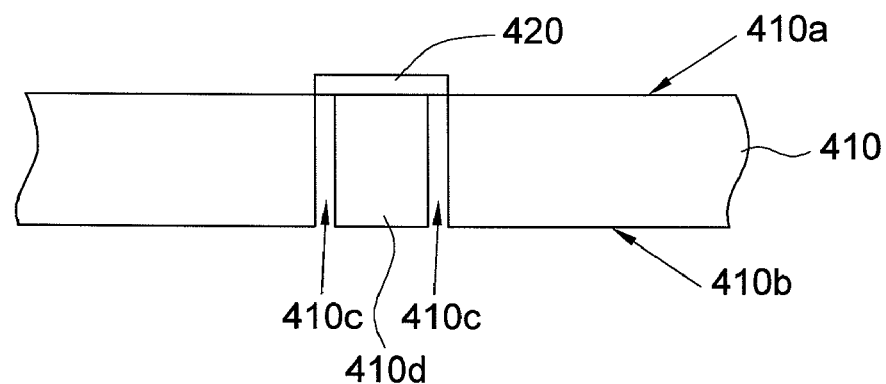

In FIG. 7C, a part of the silicon substrate 410 is removed to form a ring hole 410c and a silicon pillar 410d. In the present embodiment, the silicon substrate 410 is etched from the second surface 410b to the first surface 410a and forms the ring hole 410c. The ring hole 410c passes through the first surface 410a of the silicon substrate 410, and the first conductive wiring 420 is disposed at a pre-determined position for the ring hole 410c, so that one end of the ring hole 410c is sealed by the first conductive wiring 420.

Figure 8:
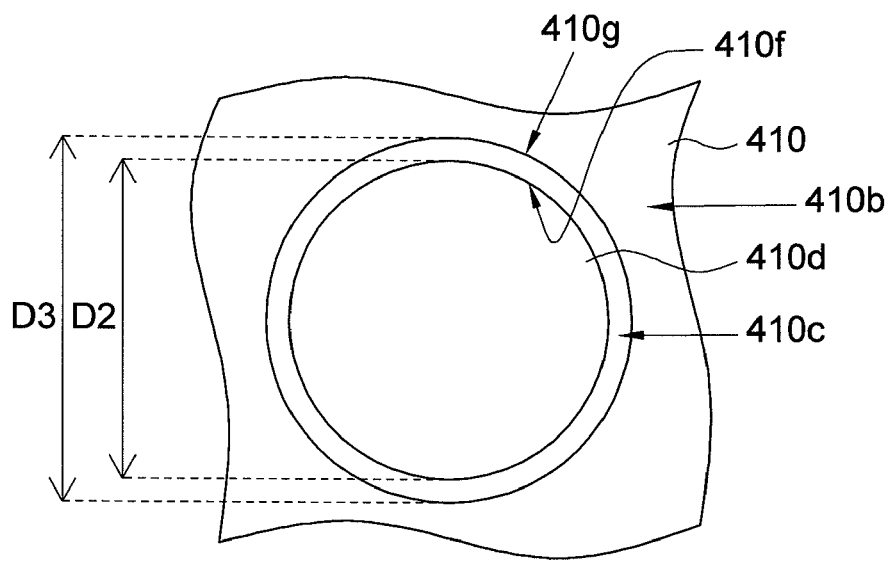
FIG. 8 shows a perspective of a second surface of a silicon substrate of FIG. 7C.

Referring to FIG. 8, a top view of a second surface 410b of the silicon substrate 410 of FIG. 7C is shown. The silicon pillar 410d is the remained structure after the ring hole 410c is formed, wherein the ring hole 410c surrounds the silicon pillar 410d. The ring hole 410c has an inner lateral wall 410f and an outer lateral wall 410g, wherein the inner lateral wall 410f is the outer surface of the silicon pillar 410d.

Figure 7D:
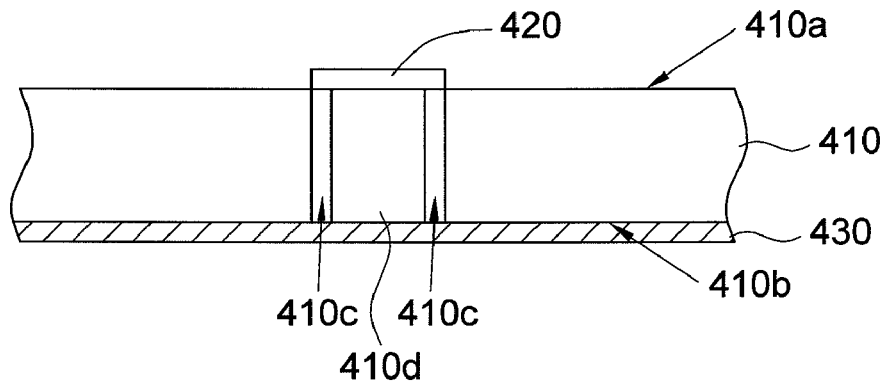

Next, as indicated in FIG. 7D, a film type photosensitive material 430 is disposed on a second surface 410b of the silicon substrate 410, wherein the photosensitive material 430 covers the ring hole 410c.

Figure 7E:
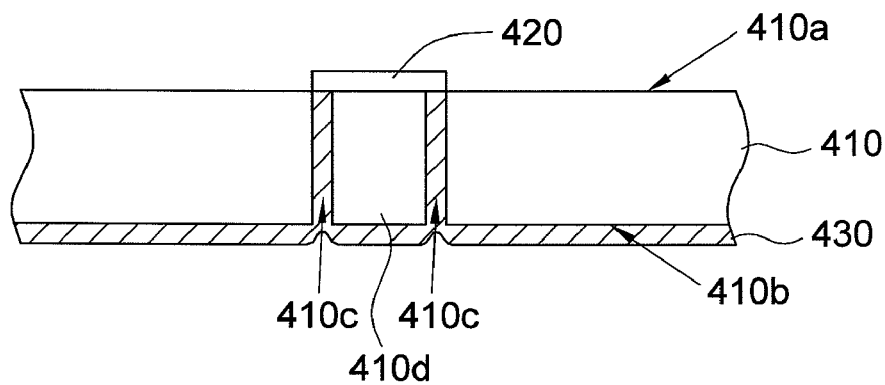

As indicated in FIG. 7E, the film type photosensitive material 430 is melted by way of low temperature baking (for example, 30~50° C.) such that part of the melted photosensitive material 430 fills the ring hole 410c.

Figure 7F:
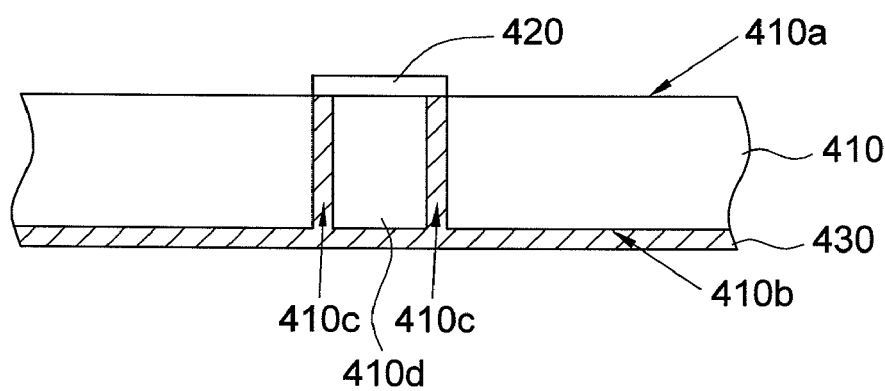

As indicated in FIG. 7F, the photosensitive material 430 is cured by way of high temperature baking (for example, 80° C.).

Figure 7G:
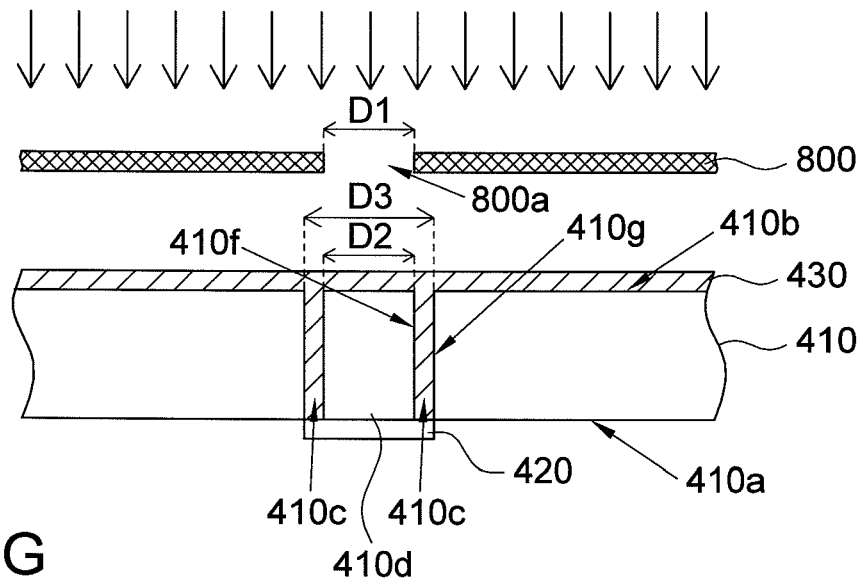

As indicated in FIG. 7G, a mask 800 is provided. The mask 800 has a mask opening 800a. The mask opening 800a corresponds to the location of the silicon pillar 410d. Also, referring to FIG. 7G and FIG. 8, the diameter D1 of the mask opening 800a is greater than or equal to the diameter D2 of the inner lateral wall 410f but smaller than the diameter D3 of the outer lateral wall 410g. To be more precisely, the diameter D1 of the mask opening 800a satisfies the following expression:

$$D2 \leq D1 < D3 \quad (1)$$

In the present embodiment of the invention, the diameter D1 of the mask opening 800a is exactly equal to the diameter D2 of the inner lateral wall 410f.

Figure 7H:
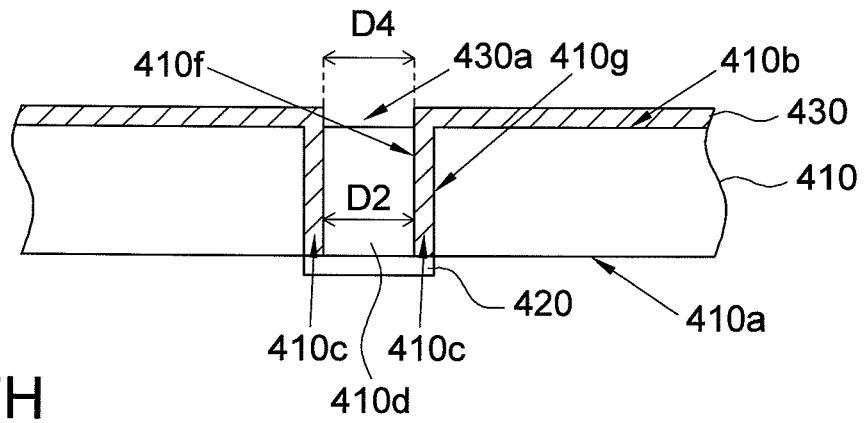

Then, as indicated in FIG. 7H, the exposed photosensitive material 430 is patterned, such that the photosensitive material 430 forms an opening 430a, wherein the size and the location of the opening 430a are determined according to the size and the location of the mask opening 800a. As the mask opening 800a of the present embodiment of the invention corresponds to the silicon pillar 410d and is equal to the diameter D2 of the inner lateral wall 410f, the opening 430a also corresponds to the silicon pillar 410d and the diameter D4 of the opening 430a is also equal to the diameter D2 of the inner lateral wall 410f.

Figure 7I:
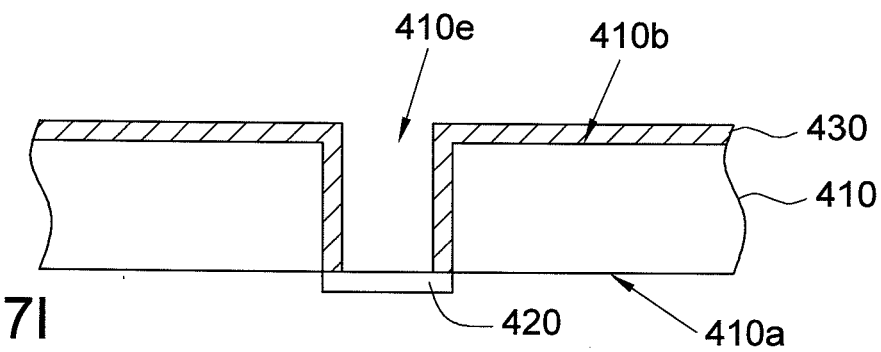
Figure 9:
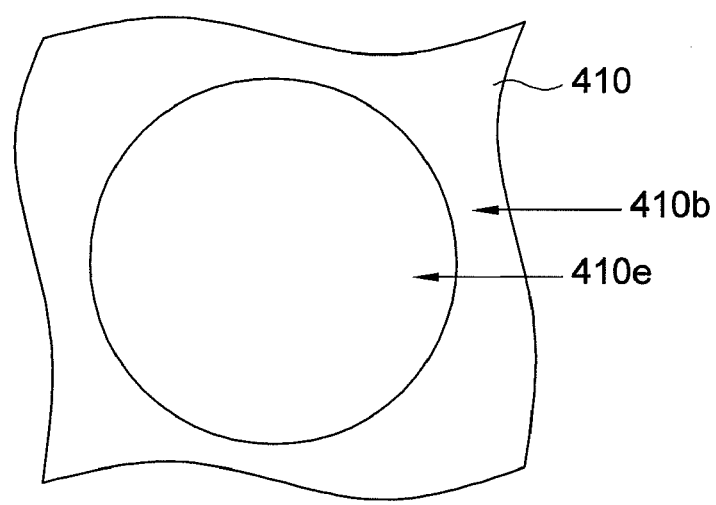
FIG. 9 shows a perspective of a second surface of a silicon substrate of FIG. 7I.

As indicated in FIGS. 7H-7I, the photosensitive material 430 having the opening 430a is used as a mask to etch the silicon pillar 410d. As the opening 430a corresponds to the silicon pillar 410d and the diameter D4 of the opening 430a is equal to the diameter D2 of the inner lateral wall 410f, the silicon pillar 410d can be completely removed. Meanwhile, referring to FIG. 7I and FIG. 9. FIG. 9 shows a perspective of a second surface 410b of a silicon substrate 410 of FIG. 7I. The silicon substrate 410 forms a through hole 410e passing through the first surface 410a and the second surface 410b, wherein one end of the through hole 110e is sealed by the first conductive wiring 120 but the other end of the through hole 410e is open.

Figure 7J:
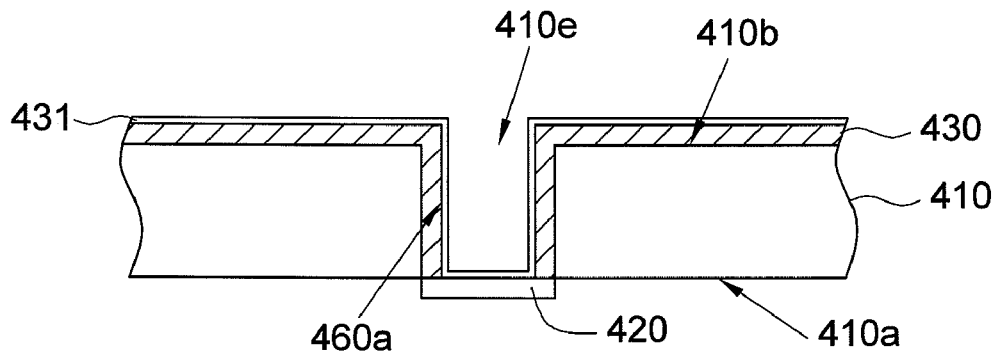
Figure 7K:
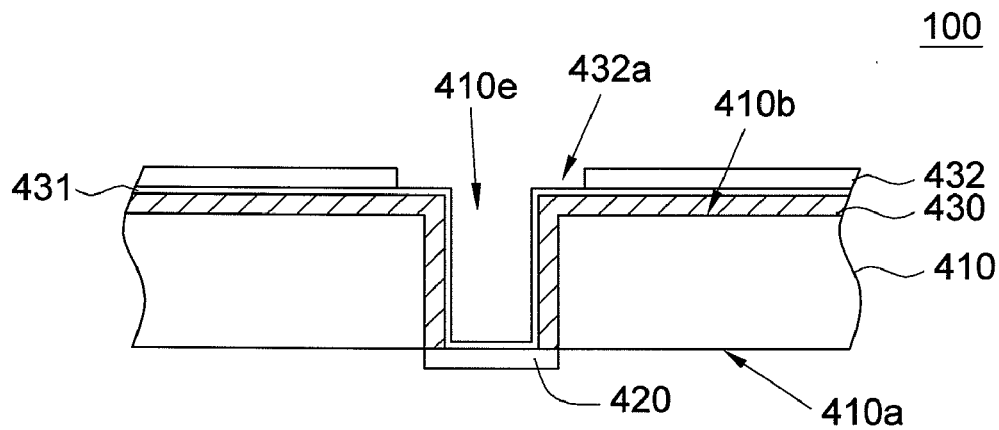
Figure 7L:
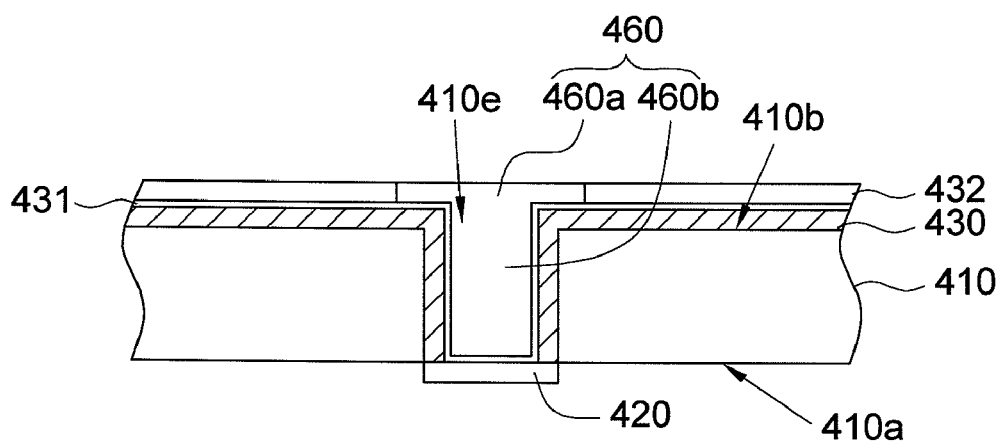
Figure 7M:
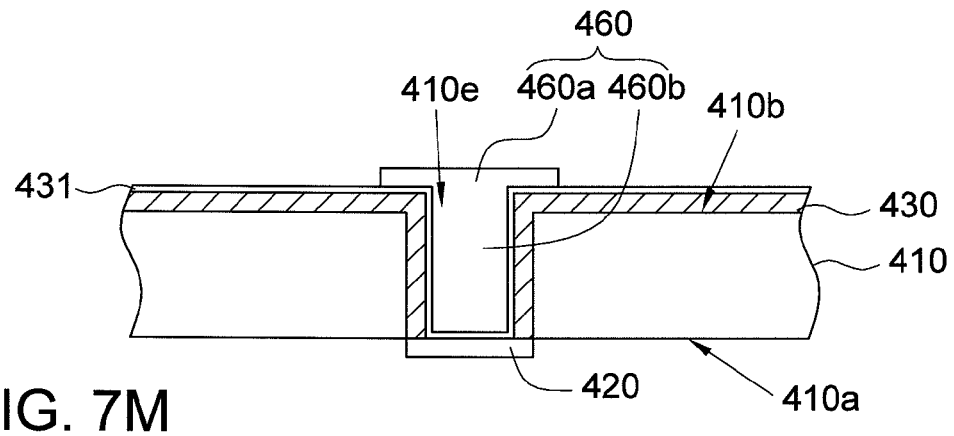
Figure 7N:
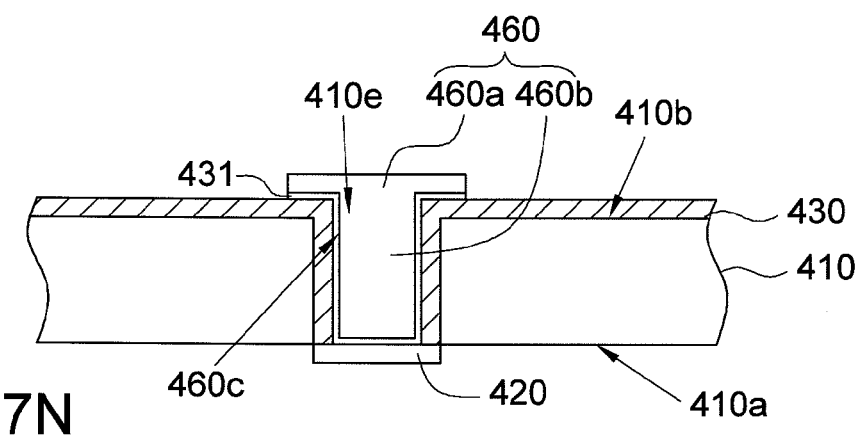
Figure 7O:
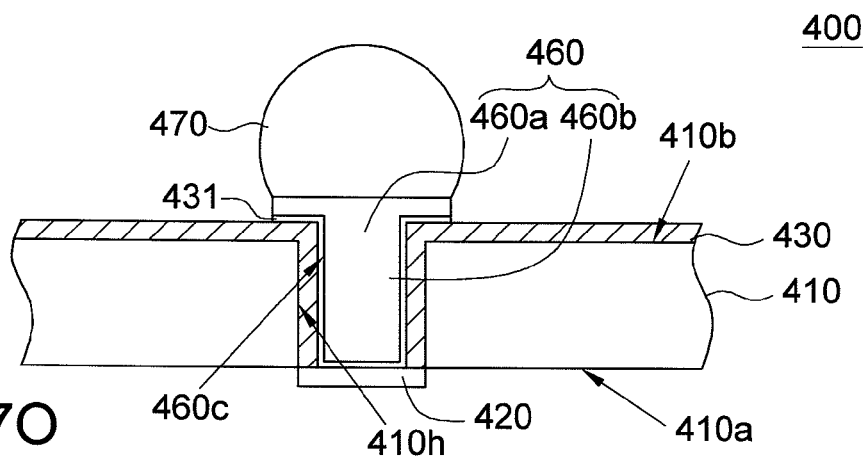

Referring to FIG. 7J, a seed layer 431 is disposed on the photosensitive material 430 and the bottom surface of the through hole 410e. Next, referring to FIG. 7K, a photosensitive layer 432 having an opening 432a is disposed on the seed layer 431. After that, referring to FIG. 7L, a conductive material 460 is filled in the through hole 410e. Wherein, the bottom part of the conductive material 460 forms a conductive pillar 460b, and the top part of the conductive material 460 forms a second conductive wiring 460a. Then, referring to FIG. 7M, the photosensensitive layer 432 (shown in FIG. 7L) is removed. Afterwards, referring to FIG. 7N, part of the seed layer 431 is etched. Wherein the second conductive wiring 460a can be used as a redistribution layer (RDL).

In the present embodiment of the invention, the conductive material 460 is disposed in the through hole 410e by way of electroplating a metal. Wherein the metal is selected form copper (Cu). After the through hole 410e is filled by the conductive material 460, the outer surface 460c of the conductive material 460 is surrounded by the photosensitive material 430.

As indicated in FIG. 7O, a conductive bump 470 is implanted on the conductive material 460 to form a conductive point.

Lastly, referring to FIG. 7O, the semiconductor structure 400 manufactured according to the present embodiment of the invention includes the silicon substrate 410, the photosensitive material 430, the conductive material 460, the first conductive wiring 420 and the conductive bump 470. The silicon substrate 410 has the through hole 410e whose two ends are respectively sealed by the first conductive wiring 420 and the conductive bump 470. The conductive material 460 is disposed in the through hole 410e. The photosensitive material 430 covers a lateral wall 410h of the through hole 410e and the second surface 410b. Thus, the outer surface 460c of the conductive material 460 and part of the second surface 410b are completely covered by the photosensitive material 430.

Figure 10A:
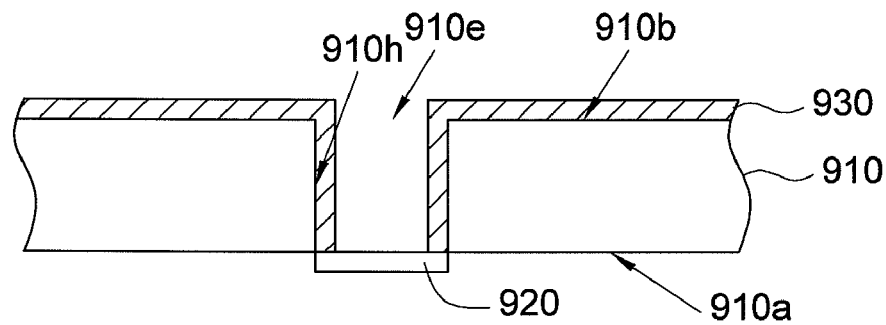
FIGS. 10A~10C are further perspectives of a method for manufacturing a semiconductor structure according to a preferred embodiment of the invention.
Figure 10B:
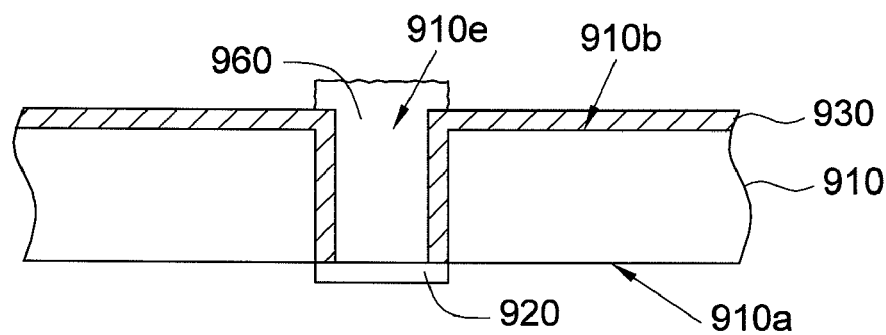
Figure 10C:
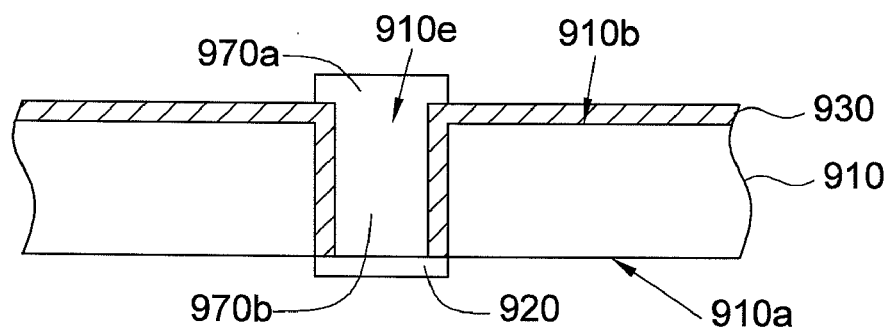

Besides, another embodiment based on the concepts of FIG. 2 is also provided. Referring to FIGS. 10A~10C, further perspectives of a method for manufacturing a semiconductor structure according to a preferred embodiment of the invention are shown. Referring to FIG. 10A, a silicon substrate 910 having a through hole 910e is provided. A first conductive wiring 920 is disposed on the first surface 910a and covers the through hole 910e. A photosensitive material 930 is cover a lateral wall 910h of the through hole 910e and a second surface 910b.

As indicated in FIG. 10B, the solder paste 960 is disposed in the through hole 910e. As indicated in FIG. 10C, the solder paste 960 is reflow to form a conductive pillar 970b and a second conductive wiring 970a. Wherein the second conductive wiring 970a can be used as a redistribution layer (RDL).

Figure 11:
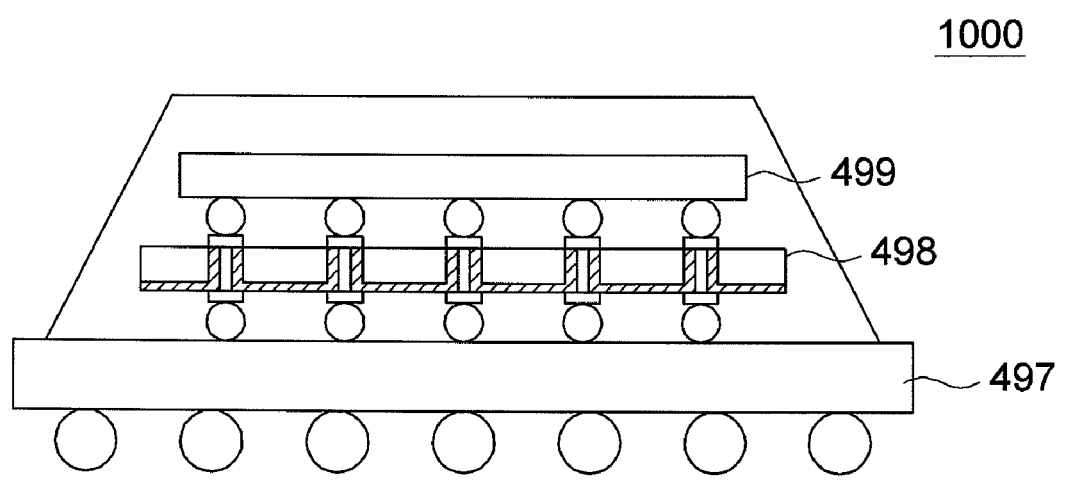
FIG. 11 shows a semiconductor package.

In addition, please refer to FIG. 11, a semiconductor package 1000 is shown. The semiconductor 1000 includes a package substrate 497 and a silicon interposer 498 and a chip 499. The silicon interposer 498 is exemplified as the semiconductor structure 400 of FIG. 7O.

The semiconductor structure and the method for manufacturing the same disclosed in the above embodiments of the invention have many advantages exemplified as follows:

Firstly, according to the manufacturing method disclosed above, the photosensitive material used as an insulating layer is disposed in the through hole and on the second surface by simple procedures without employing expensive CVD equipment, largely reducing manufacturing cost.

Secondly, according to the manufacturing method disclosed above, there is no need to polish the silicon substrate, hence simplifying manufacturing process, avoiding the silicon substrate being damaged and increasing product yield rate.

While the invention has been described by way of example and in terms of a preferred embodiment, it is to be understood that the invention is not limited thereto. On the contrary, it is intended to cover various modifications and similar arrangements and procedures and the scope of the appended claims therefore should be accorded the broadest interpretation so as to encompass all such modifications and similar arrangements and procedures.

What is claimed is:

1. A method for manufacturing a semiconductor structure, comprising:
   providing a silicon substrate;
   removing a part of the silicon substrate to form a ring hole and a silicon pillar surrounded by the ring hole;
   disposing a photosensitive material in the ring hole, wherein the photosensitive material is insulating;
   removing the silicon pillar, such that the ring hole forms a through hole and the photosensitive material covers a lateral wall of the through hole; and
   disposing a conductive material in the through hole, wherein the conductive material is surrounded by the photosensitive material.

2. The manufacturing method according to claim 1, wherein the part of the silicon substrate is removed by etching.

3. The manufacturing method according to claim 1, wherein before the step of forming the ring hole, the manufacturing method further comprises:
   forming a first conductive wiring on a first surface of the silicon substrate, wherein the first conductive wiring is disposed at a pre-determined position corresponding the ring hole.

4. The manufacturing method according to claim 3, wherein the step of disposing the photosensitive material in the ring hole comprises:
   disposing the photosensitive material on a second surface of the silicon substrate, wherein the photosensitive material covers the ring hole;
   melting the photosensitive material, such that part of the melted photosensitive material fills in the ring hole; and
   curing the photosensitive material which has been melted and filled in the ring hole.

5. The manufacturing method according to claim 1, wherein the step of removing the silicon pillar comprises:
   patterning the photosensitive material, such that the photosensitive material forms an opening corresponding to the silicon pillar; and
   using the patterned photosensitive material as a mask and etching the silicon pillar to remove the silicon pillar.

6. The manufacturing method according to claim 5, wherein the ring hole has an inner lateral wall and an outer lateral wall and in the step of patterning the photosensitive material, and the diameter of the opening is greater than or equal to the diameter of the inner lateral wall but smaller than the diameter of the outer lateral wall.

7. The manufacturing method according to claim 1, wherein the step of disposing the conductive material in the through hole comprises:
   electroplating a metal in the through hole.

8. The manufacturing method according to claim 1, wherein the step of disposing the conductive material in the through hole comprises:
   filling a solder paste in the through hole; and
   reflowing the solder paste.

9. The manufacturing method according to claim 1, further comprising:
   forming a second conductive wiring on a second surface of the silicon substrate, the second conductive wiring electrically connects the conductive material in the through hole.

10. The manufacturing method according to claim 9, further comprising:
   forming a bump on the second conductive wiring.

11. A method for manufacturing a semiconductor structure, comprising:

providing a silicon substrate, wherein the silicon substrate comprising a first surface and a second surface;

removing a part of the silicon substrate from the first surface of the silicon substrate to form a ring hole and a silicon pillar surrounded by the ring hole;

disposing a first photosensitive material in the ring hole and on the first surface of the silicon substrate, wherein the first photosensitive material is insulating;

removing the silicon pillar, such that the ring hole forms a through hole and the first photosensitive material covers a lateral wall of the through hole; and disposing a conductive material on the bottom surface of the through hole and on an outer surface of the first photosensitive material.

12. The manufacturing method according to claim 11, wherein after the step of disposing the conductive material, the manufacturing method further comprises:

disposing a second photosensitive material on the conductive material and a part of the first photosensitive material, wherein the second photosensitive material is insulating; and removing part of the second photosensitive material to form an opening, wherein the opening exposes a part of the conductive material.

13. The manufacturing method according to claim 12, wherein the silicon substrate comprises an internal wire adjacent to the second surface of the silicon substrate, and wherein the through hole is formed at a position corresponding to the internal wire.

14. The manufacturing method according to claim 13, wherein the step of forming the ring hole and the silicon pillar further comprising:

etching the silicon substrate from the first surface of the silicon substrate until the ring hole exposes a part of the internal wire; and removing the silicon pillar to expose another part of the internal wire.

15. The manufacturing method according to claim 11, wherein step of disposing the conductive material in the through hole comprises:

electroplating a thin metal film on the bottom surface of the through hole and on the outer side of the first photosensitive material.

16. The manufacturing method according to claim 11, wherein the step of removing the silicon pillar comprises:

patterning the first photosensitive material, such that the first photosensitive material forms an opening corresponding to the silicon pillar; and using the patterned first photosensitive material as a mask and etching the silicon pillar to remove the silicon pillar.

17. The manufacturing method according to claim 11, wherein the step of disposing the conductive material in the through hole comprises:

disposing a seed layer on the bottom surface of the through hole and on the outer surface of the first photosensitive material; and electroplating a metal in the through hole.

18. The manufacturing method according to claim 11, wherein the step of disposing the first photosensitive material in the ring hole comprises:

disposing the first photosensitive material on the first surface of the silicon substrate, wherein the first photosensitive material covers the ring hole;

melting the first photosensitive material, such that part of the melted first photosensitive material fills in the ring hole; and curing the first photosensitive material which has been melted and filled in the ring hole.

19. The manufacturing method according to claim 18, wherein the first photosensitive material is melted by way of low temperature baking at a temperature between 30° C. and 50° C.

20. The manufacturing method according to claim 18, wherein the first photosensitive material is cured by way of high temperature baking.

* * * * *